(12) United States Patent
Chen et al.

(10) Patent No.: US 10,892,710 B2
(45) Date of Patent: Jan. 12, 2021

(54) LC OSCILLATOR POWERING ARRANGEMENT AND METHOD OF POWERING AN LC OSCILLATOR

(71) Applicant: Stichting IMEC Nederland, Eindhoven (NL)

(72) Inventors: Yue Chen, Delft (NL); Masoud Babaie, Pijnacker (NL)

(73) Assignee: STICHTING IMEC NEDERLAND, Eindhoven (NL)

( * ) Notice: Subject to any disclaimer, the term of this patent is extended or adjusted under 35 U.S.C. 154(b) by 0 days.

(21) Appl. No.: 16/427,933

(22) Filed: May 31, 2019

(65) Prior Publication Data
US 2019/0372525 A1 Dec. 5, 2019

(30) Foreign Application Priority Data

May 31, 2018 (EP) ..................................... 18175371

(51) Int. Cl.
*H03B 5/12* (2006.01)

(52) U.S. Cl.
CPC ......... *H03B 5/1253* (2013.01); *H03B 5/1212* (2013.01); *H03B 5/1228* (2013.01)

(58) Field of Classification Search
CPC .. H03B 5/1212; H03B 5/1253; H03B 5/1265; H03B 5/1278; H03B 5/129
See application file for complete search history.

(56) References Cited

U.S. PATENT DOCUMENTS

| | | | |
|---|---|---|---|
| 6,066,991 A | * | 5/2000 | Naito ..................... H03B 5/04 331/75 |
| 6,552,618 B2 | | 4/2003 | Nelson et al. |
| 6,798,308 B2 | | 9/2004 | Sanduleanu et al. |
| 7,336,134 B1 | | 2/2008 | Janesch et al. |
| 7,355,482 B2 | | 4/2008 | Meltzer |
| 7,948,330 B2 | | 5/2011 | Seo et al. |
| 8,816,790 B2 | | 8/2014 | Sinoussi |
| 9,197,403 B2 | | 11/2015 | Gauthier et al. |
| 9,225,231 B2 | | 12/2015 | Gorisse et al. |
| 9,287,825 B2 | | 3/2016 | Atesoglu |
| 9,552,006 B1 | | 1/2017 | Gorecki et al. |
| 9,608,600 B2 | | 3/2017 | Shanan |
| 9,634,607 B2 | | 4/2017 | Nguyen et al. |

(Continued)

FOREIGN PATENT DOCUMENTS

JP 2017-130819 A 7/2017

OTHER PUBLICATIONS

European Search Report, European Patent Application No. 18175371.6, dated Dec. 4, 2018, 8 pages.

(Continued)

*Primary Examiner* — Jeffrey M Shin
(74) *Attorney, Agent, or Firm* — McDonnell Boehnen Hulbert & Berghoff LLP

(57) ABSTRACT

An LC oscillator powering arrangement comprises an LC oscillator configured to provide an oscillating signal output; a current source configured to supply the LC oscillator with a supply current, the current source during operation being controlled by a control voltage and supplied with a supply voltage subject to supply voltage ripple; and a replication block configured to generate an amplified replica of the supply voltage ripple directly from the supply voltage and to overlay the replica on the control voltage.

20 Claims, 24 Drawing Sheets

(56) References Cited

U.S. PATENT DOCUMENTS

| | | |
|---|---|---|
| 2002/0167366 A1 | 11/2002 | Sanduleanu et al. |
| 2008/0100350 A1 | 5/2008 | Pernia et al. |
| 2010/0295626 A1 | 11/2010 | Kim et al. |
| 2013/0271226 A1 | 10/2013 | Sinoussi |
| 2014/0266481 A1* | 9/2014 | Shanan ................ H03B 5/1253 331/117 FE |
| 2015/0280645 A1 | 10/2015 | Atesoglu |

OTHER PUBLICATIONS

Lim, Younghyun et al., "An External-Capacitor-Less Low-Dropout Regulator With Less Than -36dB PSRR at all Frequencies from 10kHz to 1GHz Using an Adaptive Supply-Ripple Cancellation Technique to the Body-Gate", 2017 IEEE Custom Integrated Circuits Conference (CICC). IEEE, 2017, 5 pages.

El-Nozahi, Mohamed et al., "High PSR Low Drop-Out Regulator With Feed-Forward Ripple Cancellation Technique", IEEE Journal of Solid-State Circuits, vol. 45, No. 3, Mar. 2010, pp. 565-577.

Arakali, Abhijith et al., "Low-Power Supply-Regulation Techniques for Ring Oscillators in Phase-Locked Loops Using a Split-Tuned Architecture", IEEE Journal of Solid-State Circuits, vol. 44, No. 8, Aug. 2009, pp. 2169-2181.

Sanduleanu, Mihai A.T. et al., "1GHz Tuning Range, Low Phase Noise, LC Oscillator With Replica Biasing Common-Mode Control and Quadrature Outputs", Proceedings of the 27th European Solid-State Circuits Conference. IEEE, 2001, 4 pages.

Verma, Vivek et al., "A 2.4-GHz, Wide Tuning Range GmC VCO Using a Novel Load Biasing Technique", 16th Biennial University/Government/Industry Microelectronics Symposium, IEEE, Jun. 25, 2006, pp. 201-206.

* cited by examiner

LC OSCILLATOR POWERING ARRANGEMENT AND METHOD OF POWERING AN LC OSCILLATOR

CROSS-REFERENCE TO RELATED APPLICATIONS

The present application is a non-provisional patent application claiming priority to European Patent Application No. EP 18175371.6, filed May 31, 2018, the contents of which are hereby incorporated by reference.

FIELD OF THE DISCLOSURE

The present disclosure relates to an LC oscillator powering arrangement and a method of powering an LC oscillator.

BACKGROUND

Portable devices, such as Internet-of-Things (IOT) devices, often include LC oscillators for radio communication purposes and may be powered by batteries or energy harvesters.

The devices may include DC-DC converters to transform output levels from power sources to a nominal supply voltage of circuitry of the IOT devices. However, switching operation of the DC-DC converters may cause output ripples in supply voltage. Such ripples may degrade the performance of circuitry that is sensitive to the supply voltage. For instance, ripples in supply voltage to an LC oscillator may cause periodic amplitude variations and may cause the LC oscillator to output a varying oscillating frequency leading to large spurs in the LC oscillator output spectrum

SUMMARY

The present disclosure relates to an LC oscillator powering arrangement which may ensure that an oscillation frequency output by the LC oscillator is accurately controlled.

According to an aspect of the present disclosure there is provided an LC oscillator powering arrangement, comprising an LC oscillator configured to provide an oscillating signal output; a current source configured to supply the LC oscillator with a supply current, where during operation the current source is controlled by a control voltage and supplied with a supply voltage subject to supply voltage ripple; and a replication block configured to generate a replica of the supply voltage ripple directly from the supply voltage and to overlay the replica on the control voltage.

Ripple present on the supply voltage will affect the current supplied by the current source to the LC oscillator, resulting in a time-varying oscillation amplitude. By overlaying a replica of the supply voltage ripple on the control voltage controlling the current source, this effect may be compensated for.

The replication block may be configured to generate a replica of the supply voltage ripple or an amplified replica of the supply voltage ripple. Thus, the generated replica may have the same amplitude as the ripple, be amplified with a pre-determined gain, or be amplified with a variable gain settable in a calibration procedure.

The LC oscillator powering arrangement according to the first aspect is configured to generate a replica of a ripple directly from the supply voltage. Generating the replica directly from the supply voltage should be understood as the replica being generated, over the cycle of periodic variations (ripple) of the supple voltage, from that supply voltage and not, for example, based in whole or part on the output of the LC oscillator. Using such a replica generated directly from the supply voltage, instead of, for example, from detection of the time-varying amplitude of the LC oscillator output, may avoid delay effects in the LC oscillator and detection circuitry, leading to compensation for the supply voltage ripple.

Because the LC oscillator power arrangement may be able to provide a stable supply current, despite supply voltage ripple, the use of power-consuming linear regulators, such as low-dropout linear regulators (LDOs), may be avoided. This may allow the LC oscillator to be run directly on the output of a DC-DC converter, such as a switched-mode power supply. As such, power may be saved.

According to one embodiment, the LC oscillator powering arrangement further comprises a calibration block, where the replication block is configured to amplify the replica with a tunable fractional gain settable by the calibration block, the calibration block being connected to the oscillating signal output of the LC oscillator and configured to minimize the amplitude variation of the oscillating signal output of the LC oscillator by determining an optimum value of the tunable fractional gain of the replication block.

This calibration may be performed on a time scale longer, and typically much longer, than the cycle of periodic variations (ripple) of the supple voltage.

The current source may be controlled to output a stable supply current despite supply voltage ripple by providing a replica of the supply voltage ripple to the control voltage. However, a replica on the control voltage based on a fixed pre-determined gain may not compensate for the supply voltage ripple. In particular, the arrangement may be affected by process, voltage and temperature (PVT) variations. Thus, the replica of the ripple may be amplified with an adjustable gain in order to ensure that a compensation for supply voltage ripple is provided, which is insensitive to PVT variations.

Using the calibration block, the oscillating signal may be analyzed in order to set a gain that include compensation for PVT variations or any other factors causing variation in the optimal gain between the supply voltage ripple and the replica.

The replication block may be configured to amplify the replica with a gain that is a combination of a fixed gain and a tunable fractional gain, which is set by the calibration block.

The fixed gain may be set to 1, whereas an tunable fractional gain may be determined by the calibration block in order to determine a suitable compensation for supply voltage ripple.

This allows the gain of the replica to be fine-tuned for attenuation of the amplitude variation of the LC oscillator output.

According to one embodiment, the calibration block comprises a detector configured to detect an amplitude variation of the oscillating signal output of the LC oscillator; a comparator comparing the amplitude variation with a reference voltage; and a controller connected to the comparator and configured to set the tunable fractional gain of the replication block during calibration.

Using the detector and the comparator, the calibration block may be configured to determine how the amplitude variation is affected by tuning the fractional gain. This may be used in order to determine an optimum value of the tunable fractional gain, which may then be set by the controller.

According to one embodiment, the LC powering arrangement is configured so that, during the minimizing of the amplitude variation, the reference voltage is set to a value larger than a minimum of the amplitude variation, the controller being configured to determine the optimum value of the tunable fractional gain as an average of a lower gain corresponding to a first output transition of the comparator and a higher gain corresponding to a second output transition of the comparator.

This allows the optimal gain of the replica to be accurately determined in a circuit, reducing complexity, power consumption, and cost.

According to one embodiment, the current source is a MOS transistor.

Thus, the current source may be implemented as a circuit component, which implies that the LC oscillator powering arrangement may be compact.

According to one embodiment, the current source is a PMOS transistor, the supply voltage is applied at a source terminal of the PMOS transistor, the control voltage is applied at a gate terminal of the PMOS transistor, and the supply current is drawn from a drain terminal of the PMOS transistor.

The supply current of the PMOS transistor may be controlled by a gate-to-source voltage. By providing a replica of the supply voltage ripple at the gate terminal, the supply voltage ripple provided at the source terminal may be compensated for.

However, for nanoscale PMOS transistors, the supply current may also depend on a drain-to-source voltage. This implies that an amplified replica of the supply ripple may be used.

The use of a calibration block for providing a tunable fractional gain may ensure that an amplification of the supply ripple is used, which may compensate for PVT variations.

According to one embodiment, the tunable fractional gain is settable by a n-bit digital code, where n is a predetermined integer.

This implies that a predetermined resolution of setting the tunable fractional gain may be used and that a trade-off between the time for determining the optimum value of the tunable fractional gain by the calibration block and the achievable resolution may be made, given a chosen dynamic range for the gain, by setting the predetermined integer.

According to one embodiment, the replication block comprises a replicating part, providing unitary gain, and a fractional part providing the tunable fractional gain, the fractional part comprising n injection blocks each individually switchable by an individual bit in the n-bit digital code.

This implies that the digital code may be used in order to quickly control the gain of the replication block, since an injection block may easily be controlled to contribute to the gain in dependence on a bit of the digital code.

According to one embodiment, the replicating part comprises a diode-connected PMOS transistor in series with two NMOS transistors forming a cascode, and each of the injection blocks comprises a current-source PMOS transistor in series with a switching PMOS transistor, a gate terminal of the switching PMOS transistor being connected to a corresponding the individual bit of the digital code and a drain terminal of the switching PMOS transistor being connected to a node of the cascode.

The replicating part may provide a unitary gain. By connecting a drain of the switching PMOS transistor to a node of the cascode of the replicating part, a fractional gain may be added to the unitary gain based on a signal, corresponding to the individual bit of the digital code, provided on the gate terminal of the switching PMOS transistor.

According to one embodiment, the detector comprises a peak detector, an amplifier, and a low-pass filter.

The peak detector may detect an amplitude variation of the oscillating signal output of the LC oscillator. This amplitude variation may further be amplified in order to facilitate detection of the amplitude variation. Further, the low-pass filter may ensure that the amplitude variation may be separated from an oscillation frequency of the LC oscillator and harmonics thereof.

According to one embodiment, the LC oscillator powering arrangement is provided on a single chip.

This implies that the LC oscillator powering arrangement may be compact and small size, ensuring that the LC oscillator powering arrangement is suitable for use e.g. in IOT devices.

According to another aspect of the present disclosure, there is provided a method of powering an LC oscillator, the method desensitizing the LC oscillator from supply voltage ripple and comprising: applying a supply voltage driving a current source, the supply voltage being subject to supply voltage ripple; generating a replica of the supply voltage ripple directly from the supply voltage; and applying a control voltage at the current source, the control voltage being overlaid with the replica, supplying the LC oscillator with a supply current from the current source.

Effects and features of this second aspect are largely analogous to those described above in connection with the first aspect. Embodiments mentioned in relation to the first aspect are largely compatible with the second aspect.

By applying a control voltage at a current source, wherein the control voltage is overlaid with a replica of supply voltage ripple generated directly from the supply voltage, a compensation of the supply voltage ripple on the supply current generated may be provided.

The above, as well as additional aspects, features and advantages of the present disclosure, will be understood through the following illustrative and non-limiting detailed description, with reference to the appended drawings. In the drawings like reference numerals will be used for like elements unless stated otherwise.

DETAILED DESCRIPTION

An LC oscillator powering arrangement is provided which is insensitive to supply voltage ripple so that an LC oscillator may provide an oscillation output frequency.

In the following, the operating principle of a technique for avoiding that a variation in supply voltage pushes or affects an oscillation output frequency, wherein the technique is based on replication of supply voltage ripple and in order to cancel an effect of the supply voltage ripple, will be elaborated. Particular reference will be made to a detailed circuit realization of a 5 GHz LC oscillator with the proposed feed-forward supply pushing reduction technique and an on-chip calibration loop.

Figure 1A:
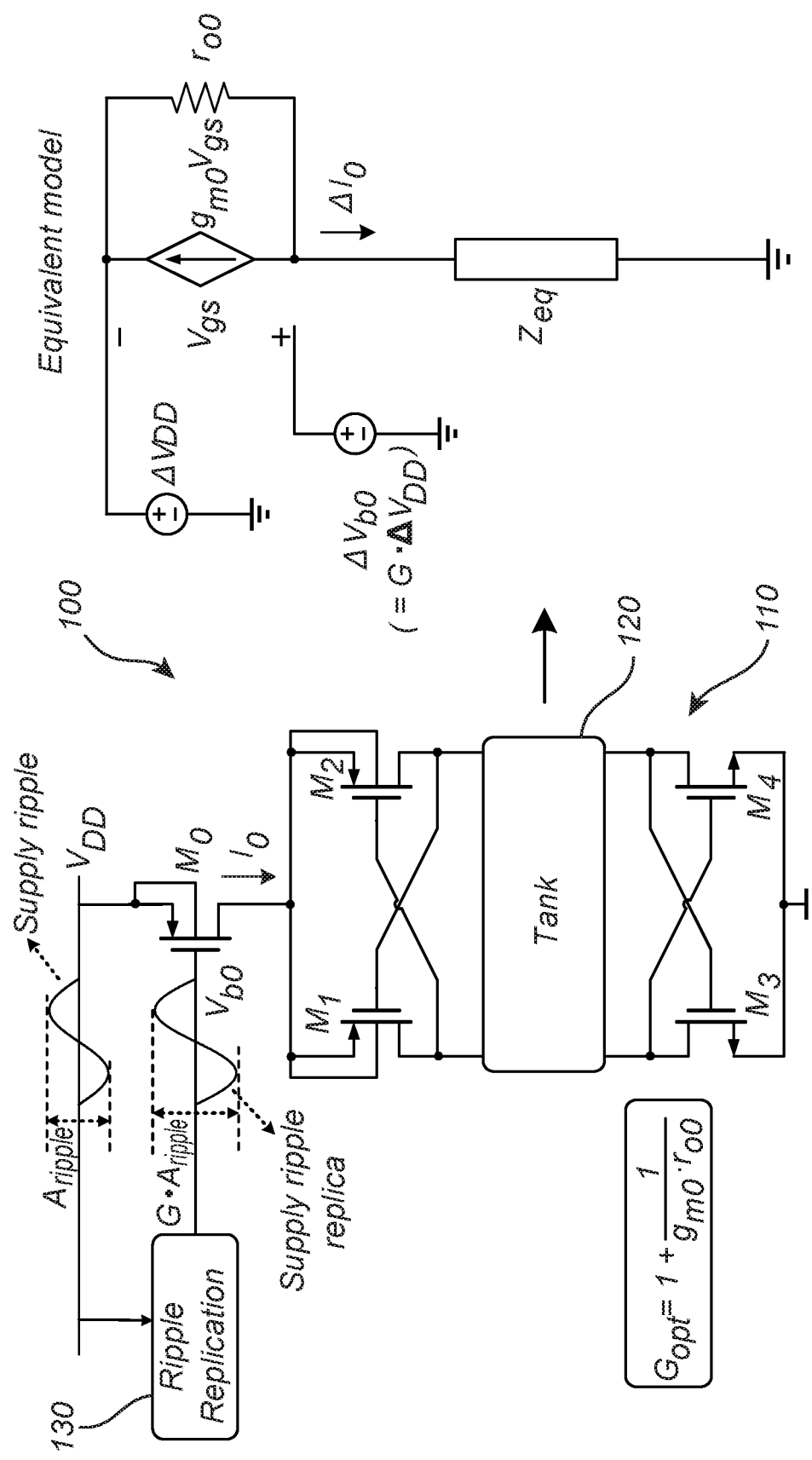
FIG. 1a is a conceptual block diagram of an LC oscillator powering arrangement with the equivalent model, according to an example embodiment.

FIG. 1a illustrates the operating principle of providing supply pushing reduction. In an LC oscillator powering arrangement 100, an LC oscillator 110 comprising a resonant tank 120, comprising an inductor and a capacitor, and cross-coupled transistors $M_1$, $M_2$, $M_3$ and $M_4$ is supplied with current $I_0$ from a current source.

In this embodiment, the current source is illustrated as being implemented by way of a MOS transistor, in this example a PMOS transistor $M_0$, supplying the LC oscillator 110 with a supply current $I_0$. The transistor $M_0$ is supplied with voltage $V_{DD}$, which is applied at its source terminal, and controlled by a control voltage $V_{b0}$, which is applied at its gate terminal. To stabilize $I_0$, and thus the oscillating signal output $V_{osc}$ being output by the LC oscillator 110, in face of $V_{DD}$ variations, a replica G $A_{ripple}$ of the supply ripple $A_{ripple}$ is generated at a ripple replication block 130, directly from the supply voltage $V_{DD}$, and overlaid on the gate of PMOS current source transistor $M_0$. In one case, if the replica is an exact copy of the supply voltage, i.e., G=1, the gate-to-source voltage $V_{gs}$ of the PMOS current source transistor $M_0$ will be stabilized. As a result, the variation of $I_0$, and thereby of $V_{osc}$, may be suppressed.

The variation of oscillating frequency $f_{osc}$ of the LC oscillator 110 with the supply voltage, $V_{DD}$, may be caused by the variation of parasitic capacitances seen by the resonant tank 120. The cross-coupled transistors $M_1$-$M_4$ provide a negative transconductance to sustain the oscillation and will experience cut-off, saturation and triode operating regions during each oscillation cycle. When $V_{DD}$ varies, the supply current, $I_0$, and the corresponding oscillation amplitude, $V_{osc}$, will also vary. Thus it will change the time interval during which the transistors stay in each operating region. Since the gate capacitance of MOS transistors shows nonlinear dependence on the voltages at their terminals (i.e. gate-to-source voltage $V_{gs}$ and drain-to-source voltage $V_{ds}$), the change in the operating states of MOS transistors would vary the equivalent parasitic capacitance, $C_{par,equ}$. Thus, the oscillating frequency will be pushed. If a periodical ripple is on $V_{DD}$, $I_0$ and $V_{osc}$ will also show periodical variations. Therefore, the change of $C_{par,equ}$ will also be periodical and could manifest itself as large spurs in the output spectrum of the LC oscillator 110. Stabilizing $I_0$ and $V_{osc}$ under $V_{DD}$ variations allows a clean output spectrum to be obtained when $V_{DD}$ contains ripples.

If $M_0$ is a device, whose drain current is controlled by its $V_{gs}$ according to the square law, then an exact copy of the supply ripple waveform is may be used at its gate terminal $V_{b0}$ to keep $I_0$ and $V_{osc}$ constant. However, for nanoscale CMOS technologies, a channel-length modulation effect is not negligible. This means that the drain current of $M_0$ may depend on its Vs. Thus in order to compensate for residue current variation due to the variation of $V_{ds}$ of $M_0$, some embodiments may use an amplified replica of the supply ripple in the waveform at $V_{b0}$.

FIG. 1a also shows the equivalent model to estimate the optimum gain ($G_{opt}$). Based on this model, the supply voltage variation, $\Delta V_{DD}$, induced supply current variation, $\Delta I_{0,VDD}$, could be calculated as $$\Delta I_{0,V_{DD}} = \frac{1 + g_{m0} \cdot r_{o0}}{r_{o0} + Z_{eq}} \Delta V_{DD}, \quad (1)$$

while the supply current variation induced by control voltage variation $\Delta V_{b0} = G \cdot \Delta V_{DD}$ is $$\Delta I_{0,V_{b0}} = -\frac{g_{m0} \cdot r_{o0}}{r_{o0} + Z_{eq}} \Delta V_{b0}, \qquad (2)$$

where $Z_{eq}$ is the large-signal equivalent impedance of the cross-coupled transistors $M_1$-4 and the resonant tank 120 that is seen by $M_0$, while $g_{m0}$ and $r_{o0}$ are the effective transconductance and output resistance of $M_0$, respectively. To compensate for the supply current variation due to $V_{ds}$, the magnitudes of (1) and (2) should be equal. Hence, $G_{opt}$ may be calculated as $$G_{opt} \approx 1 + \frac{1}{g_{m0} \cdot r_{o0}}. \qquad (3)$$

Since $g_{m0} \cdot r_{o0}$ is relatively large (e.g. >10), $G_{opt}$ is slightly larger than 1.

Figure 2:
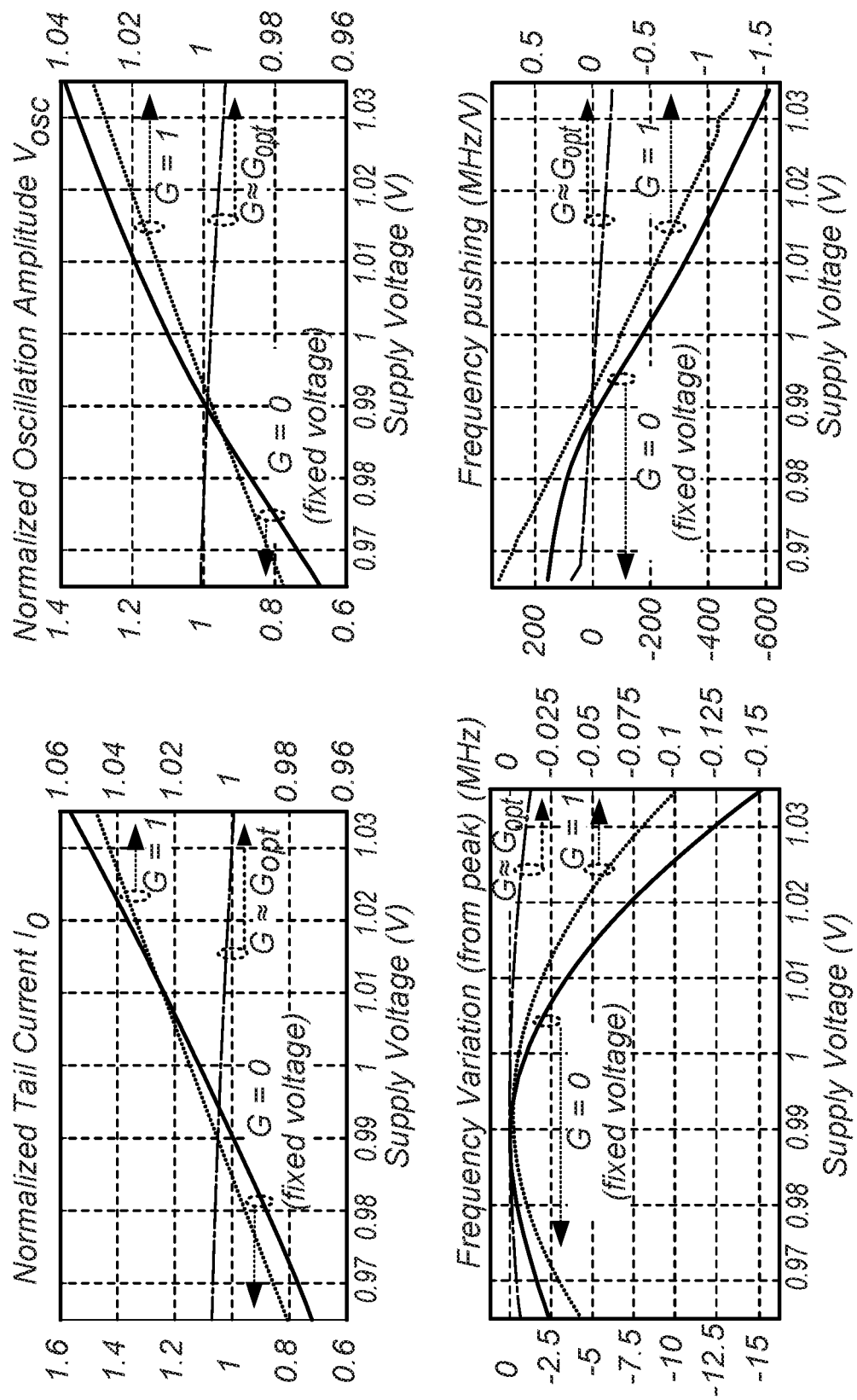
FIG. 2 shows simulation results of an LC oscillator with the proposed technique, according to an example embodiment.

As shown in simulation results in FIG. 2, the variations of $I_0$ and $V_{osc}$ may be largely suppressed when the waveform applied at $V_{b0}$ is the same as that of the supply ripple (gain, G=1). Hence, the frequency variations due to the supply voltage are largely reduced, resulting in a much lower supply pushing of the oscillator. FIG. 2 also shows that $I_0$ and $V_{osc}$ are further stabilized (i.e. ~10 times smaller variations compared to the G=1 case) under supply variations when G≈$G_{opt}$, thus the supply pushing of the oscillator becomes much lower.

Portable devices such as Internet-of-Things (IOT) devices powered by batteries or energy harvesters may include buck and/or switching DC-DC converters to transform the output levels of energy sources to the nominal supply voltage of IOT electronic circuitry. Due to the switching operation of DC-DC converters, the resulting output ripples can degrade performance of the supply-sensitive circuitry, such as LC-tank oscillators, when connected directly. This supply pushing of LC-tank oscillators may be reduced to allow them to operate from DC-DC converters, which naturally contain high level of ripples. To avoid this, a low dropout (LDO) linear regulator is usually inserted after the switching converter to stabilize the supply voltage. However, the extra voltage overhead (~200 mV) may worsen the system's power efficiency (~80% under 1V supply). This will make it even more critical with the supply scaling down with technology.

In the present disclosure, there is proposed a feed-forward supply ripple replication and cancellation technique which may be wholly contained within an LC oscillator in order to make it practically insensitive to supply ripples of switching DC-DC converters. Since, in the present disclosure, the LC oscillator may be driven directly from the output of the DC-DC converter, no extra voltage headroom may be used. Therefore, power can be saved.

Figure 1B:
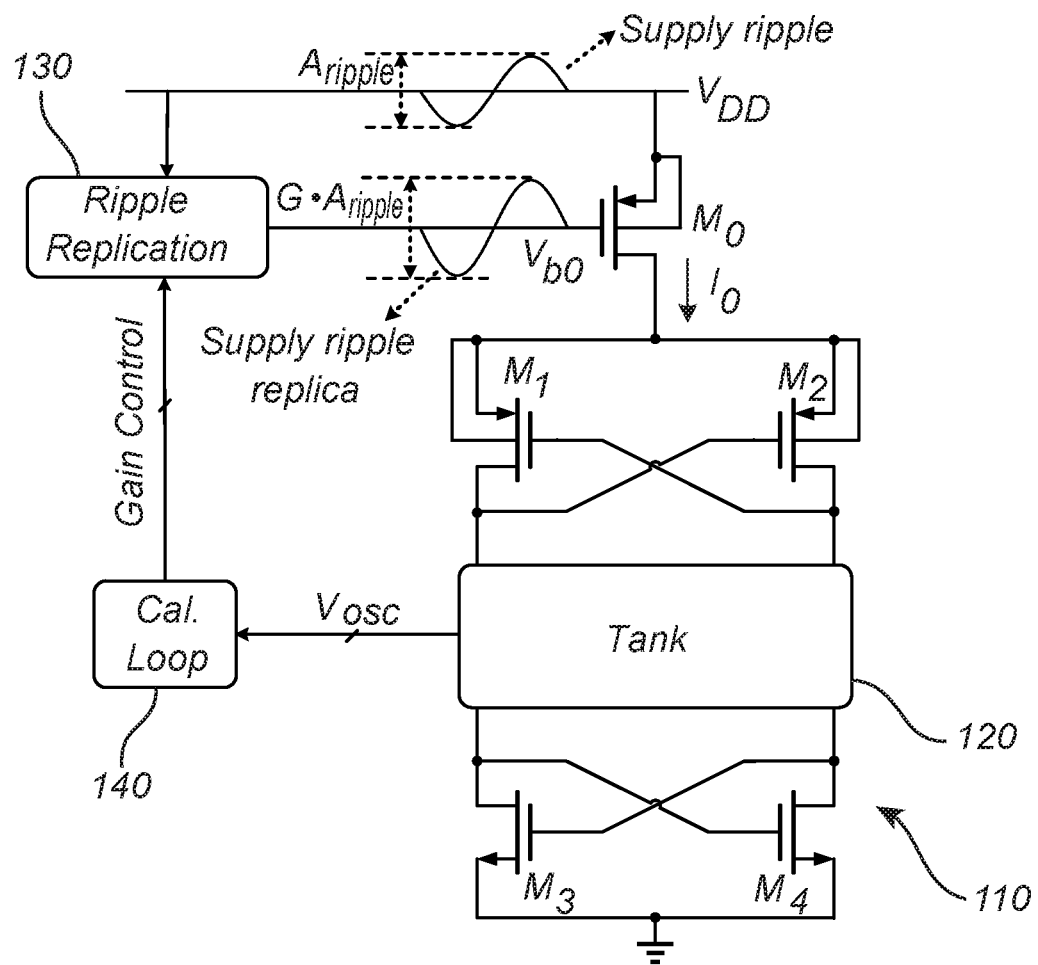
FIG. 1b is a conceptual block diagram of the proposed supply pushing reduction technique using a calibration loop, according to an example embodiment.

Optionally, a calibration block, here in the form of a calibration loop 140, may also be implemented, optionally integrated on-die, as shown in FIG. 1b. The replication block 130 is configured to amplify the replica with a tunable fractional gain settable by the calibration block 140, with the calibration block 140 being connected to the oscillating signal output $V_{osc}$ of the LC oscillator.

As can be gathered from equation 3, the optimum gain is prone to PVT variations. The calibration loop 140 may compensate for such variations, improving performance as compared to using a pre-determined gain.

Figure 3:
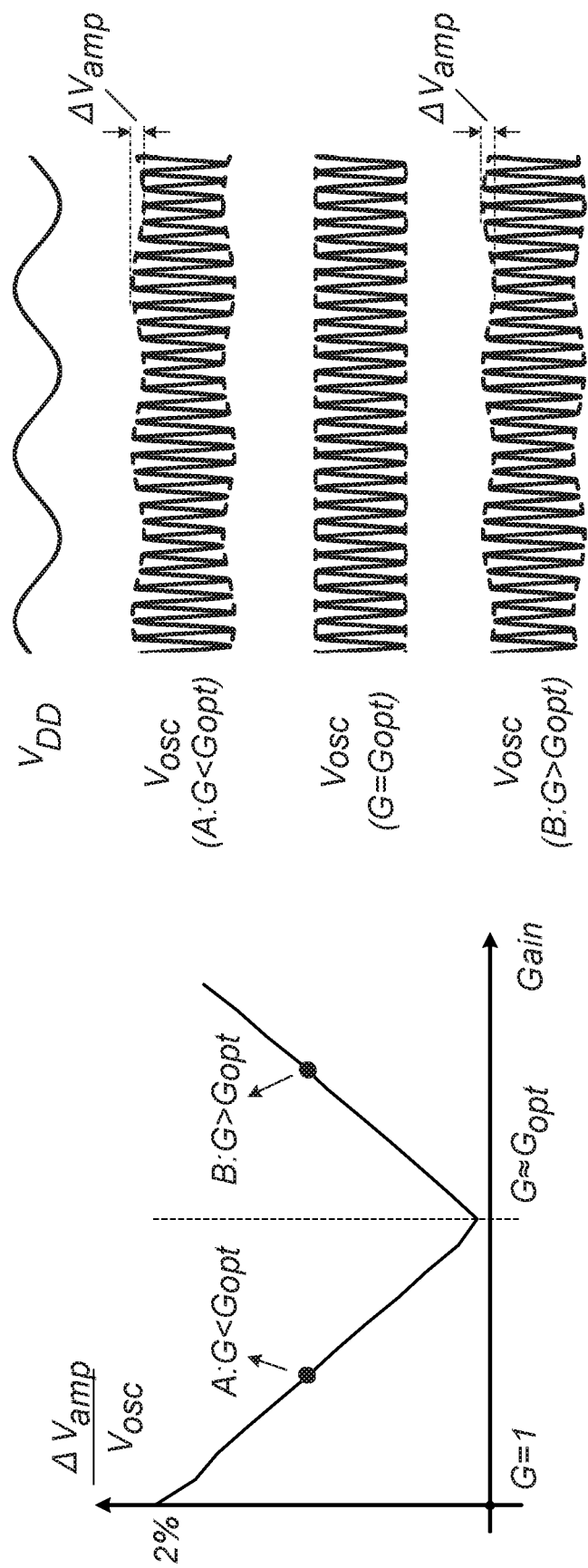
FIG. 3 shows the operating principle of the calibration loop based on oscillation amplitude variation ($\Delta V_{osc}$), according to an example embodiment.

The calibration scheme is based on measuring the variation of the oscillation amplitude, $\Delta V_{amp}$, in response to the $V_{DD}$ perturbations. FIG. 3 shows the operating principle of the calibration loop 140. When G<$G_{opt}$ (case A), $\Delta I_{0,V_{b0}}$ is smaller than $\Delta I_{0,VDD}$, so $\Delta V_{amp}$ is in phase with $\Delta V_{DD}$ and decreases in magnitude as G gets closer to $G_{opt}$. However, when G>$G_{opt}$ (case B), $\Delta I_{0,V_{b0}}$ becomes larger than $\Delta I_{0,VDD}$. Then, $\Delta V_{amp}$ is out of phase with $\Delta V_{DD}$, and its magnitude increases again with the increase of G. At the optimum point, G=$G_{opt}$, and a constant oscillation, amplitude is maintained under supply variations.

Thus, the calibration loop 140 may be configured to measure $\Delta V_{amp}$ under different gain settings to calculate the optimum operating point for the oscillator circuit. Thus, the calibration block 140 is configured to minimize the amplitude variation $\Delta V_{amp}$ of the oscillating signal output $V_{osc}$ of the LC oscillator 110 by determining an optimum value of a tunable fractional gain G of the replication block 130. The calibration loop 140 may be configured to only be active during calibration.

Figure 4:
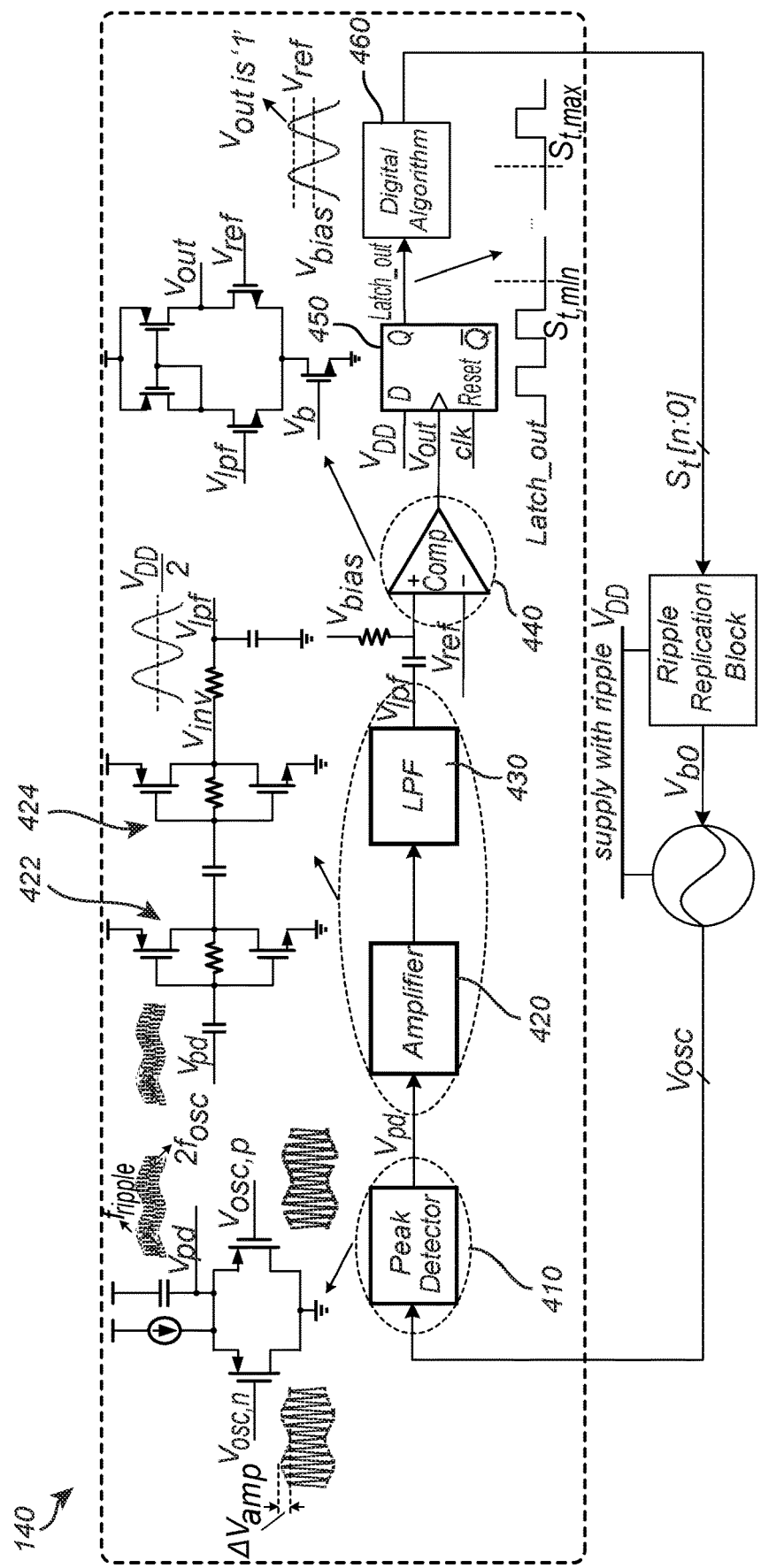
FIG. 4 is a block diagram of a calibration loop, according to an example embodiment.

FIG. 4 shows an example block diagram of an integrated calibration loop 140. As discussed above, the perturbation of the oscillation amplitude, $\Delta V_{amp}$, is used in the loop 140 as a stimulus to calibrate $G_{opt}$. The outputs of the oscillator may be first connected to a peak detector 410. The output $V_{pd}$ of the peak detector 410, contains two frequency components: the one at $f_{ripple}$, and the additional one at the second harmonic of the oscillation frequency, $f_{osc}$. $V_{pd}$ may then be amplified through self-biased inverters.

Two inverter stages 422, 424 with bandwidth of ~20 MHz may be implemented. The inverter stages 422, 424 amplify the small input level at $V_{pd}$ (e.g. 1 mV) to a larger amplitude (e.g., 250 mV) at the output $V_{inv}$, with a relatively large gain (e.g. 48 dB).

The output of the inverter chain, $V_{inv}$, may be filtered by an RC low-pass filter (LPF) 430. The cut-off frequency of the LPF 430 may be set to pass through the frequency component at $f_{ripple}$, while the second harmonic at $2 \times f_{osc}$ is filtered out. If there is any mismatch in the input differential pair of the peak detector, $V_{pd}$ would contain a third frequency component at $f_{osc}$. Since $f_{osc}$ (several GHz) is much higher than $f_{ripple}$ (tens of MHz), this component is filtered out by the inverter chain and the LPF. Hence, the mismatch in the peak detector will not affect the calibration results.

Figure 6A:
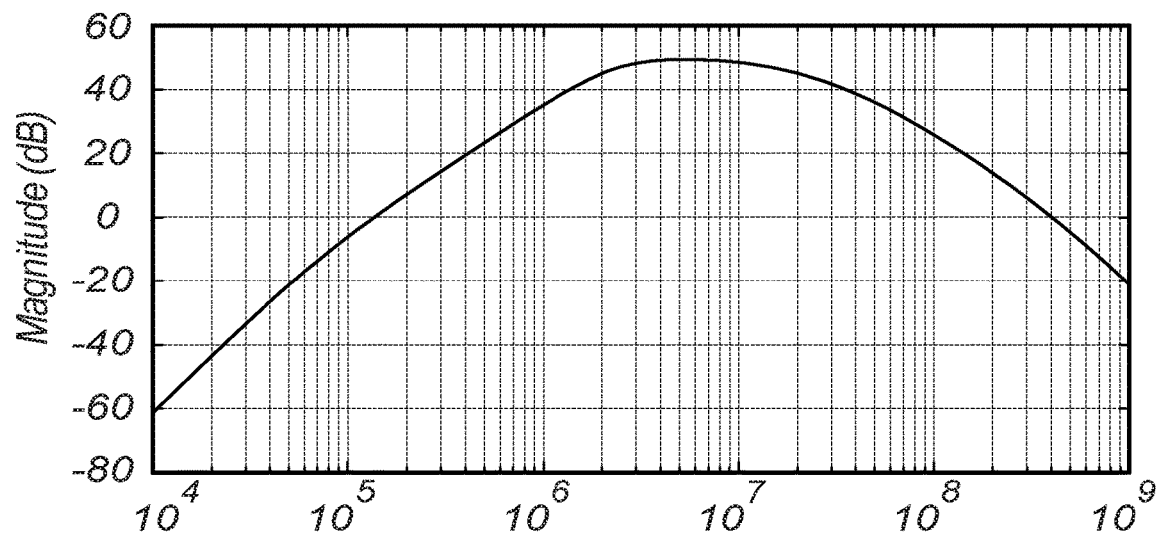
FIG. 6a shows a simulated transfer function from peak detector output to comparator input in the calibration loop, according to an example embodiment.

The resulting transfer function from amplifier 420 input $V_{pd}$ to LPF 430 output $V_{lpf}$ is shown as a function of frequency in FIG. 6a.

Thus, the calibration block 140 comprises a detector—comprising the peak detector 410, the amplifier 420, and the LFP 430—configured to detect the amplitude variation $\Delta V_{amp}$ of the oscillating signal output $V_{osc}$ of the LC oscillator 110.

The output of the LPF 430, $V_{lpf}$, may then be compared with a reference value, $V_{ref}$, through a comparator 440. $V_{ref}$ is roughly set to a voltage higher than the product of the $\Delta V_{amp}$ and the DC gain of the peak detector 410 cascade with the inverter stages 422, 424.

The output $V_{out}$ of the comparator 440 may be connected to the clock terminal of a D flip-flop (DFF) 450. When $V_{ref}$ is crossed, the comparator's 440 output becomes high, triggering the output of the DFF to flip to 1. A digital algorithm in the loop monitors the latch output, Latch_out, and may calculate the optimum control code $S_t$ (see below) for the ripple replication block 130. Other ways of controlling the replication block 130 are equally possible.

Figure 5B:
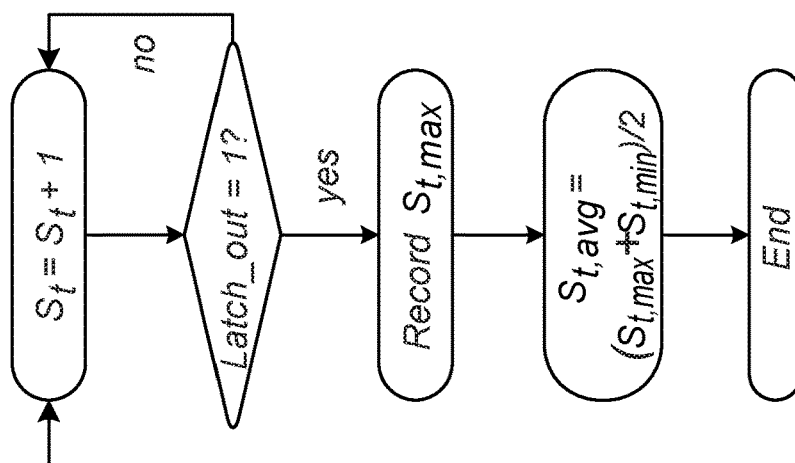
FIG. 5b is a flow chart of the calibration loop with the proposed algorithm, according to an example embodiment.
Figure 5B:
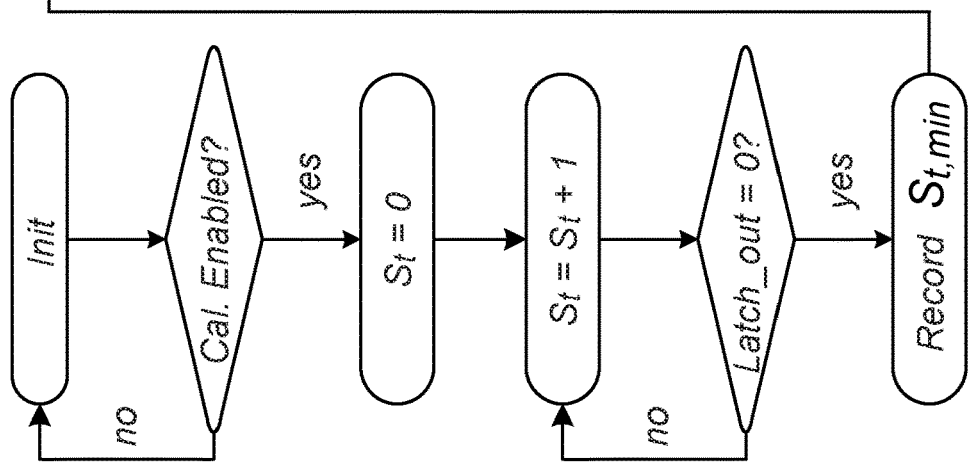
Figure 5A:
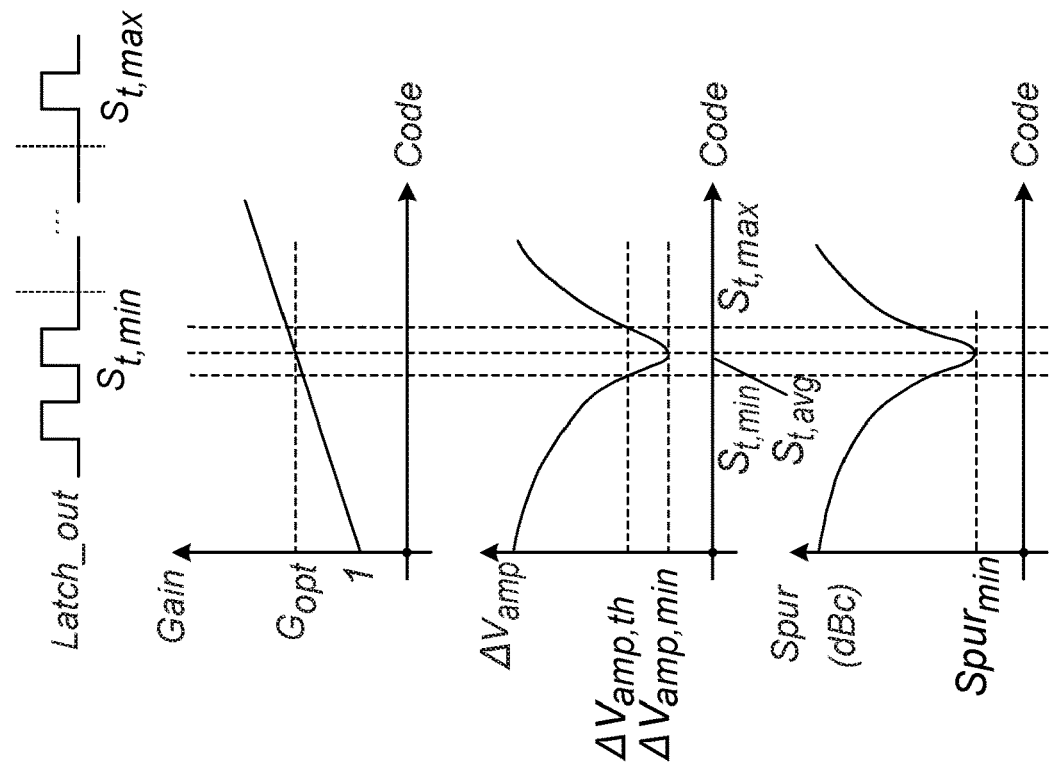
FIG. 5a shows the operating principle of the calibration loop using a proposed algorithm, according to an example embodiment.

The digital block 460 attempts to find the minimum point of $\Delta V_{amp}$ vs. the control code ($\Delta V_{amp,min}$ in FIG. 5a). FIG.

5a shows the operating principle of the proposed technique. The reference voltage, $V_{ref}$, at the comparator input is roughly set to a value corresponding to an oscillation amplitude variation of $\Delta V_{amp,th}$, which is higher than $\Delta V_{amp,min}$. The calibration process starts from a small value of $S_t$, where $G<G_{opt}$ and $\Delta V_{amp}>\Delta V_{amp,th}$. Thus, the initial value of Latch_out is 1. The algorithm keeps increasing $S_t$, which decreases $\Delta V_{amp}$ as G approaches $G_{opt}$. When $\Delta V_{amp}$ becomes lower than $\Delta V_{amp,th}$, Latch_out changes from 1 to 0. The algorithm records this code as $S_{t,min}$, and then increases $S_t$ again. When $S_t$ is large enough, $\Delta V_{amp}$ would be higher than $\Delta V_{amp,th}$ again, and Latch_out switches back to 1. The algorithm records this code as $S_{t,max}$, and the optimum code, $S_{t,avg}$, is calculated as the average of these two recorded codes. FIG. 5b reveals the operational flow chart of this calibration process. The high-pass response of the loop due to AC-coupling limits the settling time when $S_t$ changes. In this example, the corner frequency is designed to be ~2.5 MHz, resulting in a settling time of 0.4 is per step. Lower corner frequency could be used to detect lower ripple frequency at the expense of longer settling time.

Thus, the LC powering arrangement 100 is configured so that, during the minimizing of the amplitude variation $\Delta V_{amp}$, the reference voltage $V_{ref}$ is set to a value larger than a minimum $\Delta V_{amp,min}$ of the amplitude variation, a controller, here in the form of digital block 460, being configured to determine the optimum value $G_{opt}$ of the tunable fractional gain G as an average of a lower gain corresponding to a first output transition of the comparator 440 and a higher gain corresponding to a second output transition of the comparator 440.

Thus, in the present disclosure, a calibration algorithm is proposed whereby one comparator 440 without any offset calibration can be used in the loop. Otherwise, to precisely detect $\Delta V_{amp,min}$, a set of comparators and DFFs may be used. The simulated amplitude variation at the output of the LPF is ~300 mV. Thus, 20 comparators, followed by a DFF each, are able to achieve a voltage resolution of 15 mV Some offset calibration techniques could be used to reduce the input referred offset of comparators to a level much lower than the voltage resolution. The digital algorithm would then count the number of is in the output of the DFFs to determine $\Delta V_{amp}$. Such a method would increase the design complexity greatly. Thus, the method of the present disclosure achieves an accurate determination of $\Delta V_{amp,min}$ while retaining low design complexity.

Figure 6B:
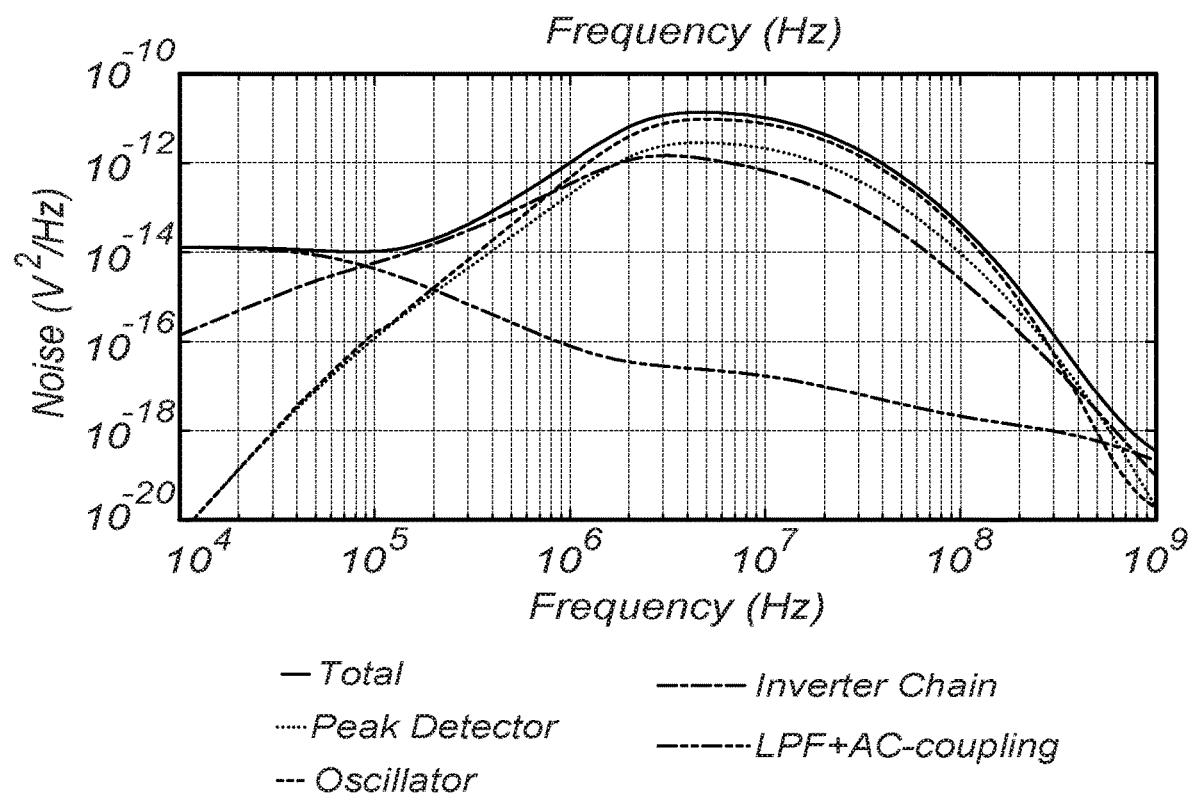
FIG. 6b shows a simulated power spectrum density of noise at comparator input with contributions from different noise sources, according to an example embodiment.

FIG. 6b shows the simulated power spectrum density (PSD) of noise at the comparator's input. A major part of the noise is contributed by the oscillator itself. The differential output of the oscillator is less affected by the variation of the common mode voltage, but the output level of the peak detector would be modulated. Thus, the calibration loop 140 is more sensitive to the common mode noise from the LC oscillator 110, e.g. noise of the supply current source. After being shaped by the transfer function of the inverter chain 420 and LPF 430, the common-mode noise is finally passed to the comparator's 440 input. From FIG. 6b, the integrated noise is around 14 mV, corresponding to ~0.095 mV equivalent input noise at the input of the peak detector at 5 MHz $f_{ripple}$. To achieve less than −50 dBc spur level, $\Delta V_{amp}$ is simulated to be ~1.8 mV (0.64 mV$_{rms}$), leading to a SNR of 16.5 dB, which is sufficient for an effective calibration.

Figure 7:
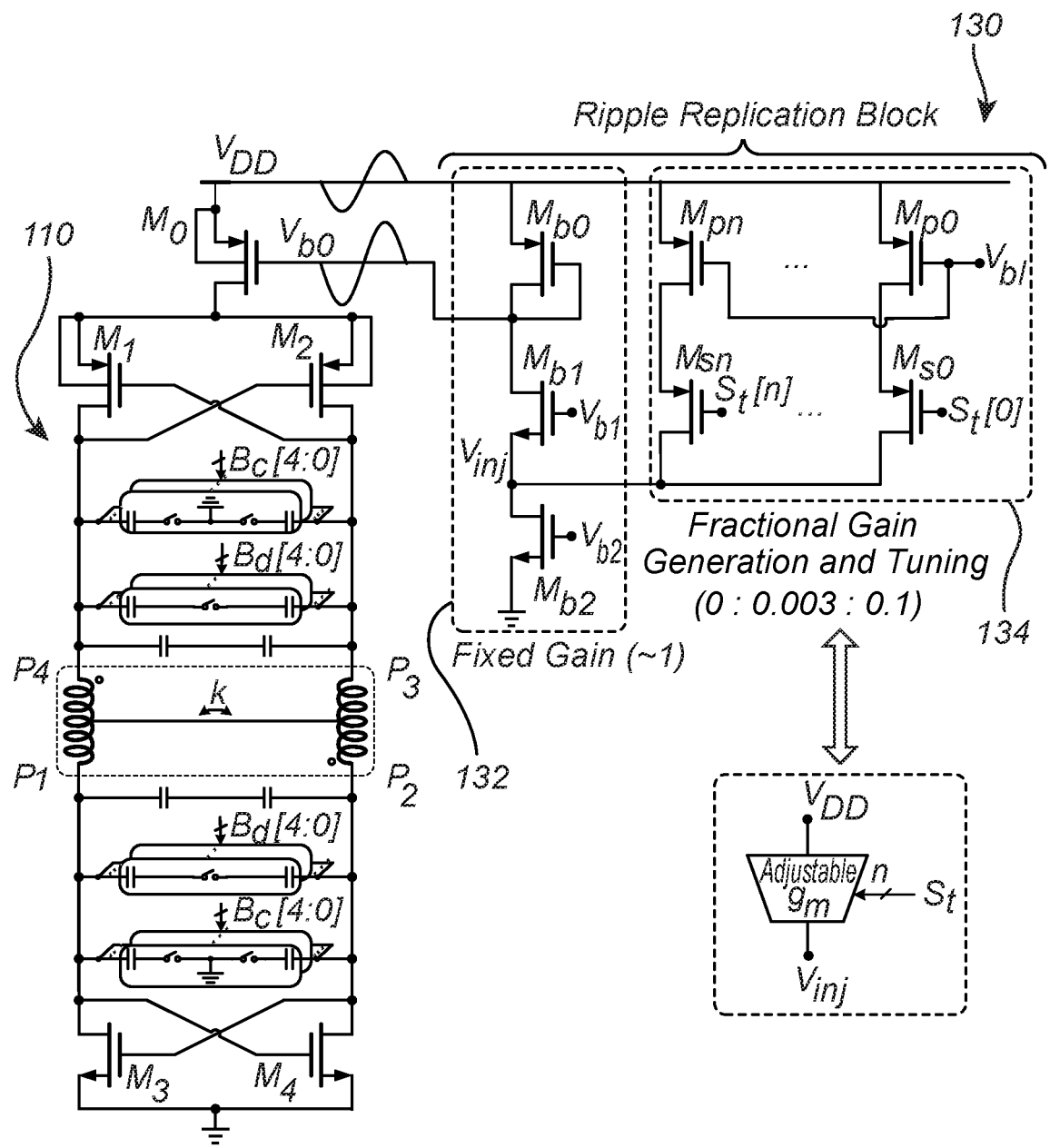
FIG. 7 is a schematic of an implemented LC oscillator with a ripple replication block, according to an example embodiment.

FIG. 7 shows a schematic of an example ripple replication block 130 together with an example LC oscillator 110. The ripple replication block 130 is proposed to bias the gate terminal of current source $M_0$ of the LC oscillator 110. To generate the replica with the gain G larger than 1, the ripple replication block 130 is logically divided into two parts. The first part 132 (left dashed box in FIG. 7) contains a diode-connected PMOS transistor, $M_{b0}$, in series with two cascode NMOS transistors, $M_{b1,2}$. Due to the high output impedance of the cascode, $M_{b0}$ can replicate the supply ripple to $V_{b0}$ with a fixed and unitary gain of 1. Thus, the first term on the right hand side of equation 3 is covered by this part.

To boost the gain above 1, the fractional part 134 (right dashed box in FIG. 7) is introduced to inject some extra current proportional to $V_{DD}$ into the cascode node, $V_{inj}$. To digitally control the fractional gain, current source PMOS transistors $M_{pk}$ (k=0, 1, ... n) are individually turned on/off by switch PMOS transistors $M_{sk}$ (k=−0, 1, ... n) according to the digital code $S_t$ generated by the calibration loop 140. Switching PMOS transistor $M_{pk}$ drain terminal is connected to the node $V_{inj}$ of the cascode.

Thus, the tunable fractional gain is settable by a n-bit digital code, where n is a predetermined integer and the fractional part of the replication block comprises n injection blocks each individually switchable by an individual bit in the n-bit digital code.

The fractional part thus provides an adjustable transconductance between $V_{DD}$ and $V_{inj}$. The final gain G provided by the ripple replication block 130 can be approximated as $$G \approx 1 + \frac{g_{m,f}}{g_{m,b0}} \quad (4)$$

where $g_{m,f}$ and $g_{m,b0}$ are the total equivalent transconductance of the fractional part 134 and the transconductance of $M_{b0}$, respectively. Since $G_{opt}$ is only slightly larger than 1, the $g_{m,f}$ should be much smaller than $g_{m,b0}$. Therefore, the total current injected into $V_{inj}$ may be smaller than the current consumed by $M_{b0}$, and would not lead to a large variation of the operating point of the LC oscillator. Moreover, the cascode transistor $M_{b1}$ could be removed for designs with lower $V_{DD}$. The slightly reduced gain provided by the first part could be compensated by slightly increasing $g_{m,f}$.

In this design, a channel length of 120 nm is used for $M_0$ leading to a load of ~800 fF. When $g_m/I_{ds} \approx 12$, the total current consumption (including the fractional part) is ~200 µA with a maximum G of ~1.1. A 5-bit thermometer code is implemented to cover the aforementioned maximum G. The PMOS transistors in the fractional part are sized to achieve tuning resolution of ~0.003 as a trade-off between the resolution and calibration time. The unit-gain bandwidth, co, of the ripple replication block is established by both the frequency of the supply ripple, $f_{ripple}$, and the tolerable phase shift between the ripple and the replica. To guarantee <−50 dBc spur level at $f_{ripple}$=20 MHz, a $\omega_u$ of 450 MHz may be used based on simulations. Together with the capacitive load at the output of the ripple replication block, this bandwidth determines the current consumption of this block. A smaller capacitance could be achieved when $M_0$ is designed with a minimum channel length. However, the $G_{opt}$ would increase, which could adversely affect the tuning resolution and/or calibration time. The present design provides a compromise.

Figure 8A:
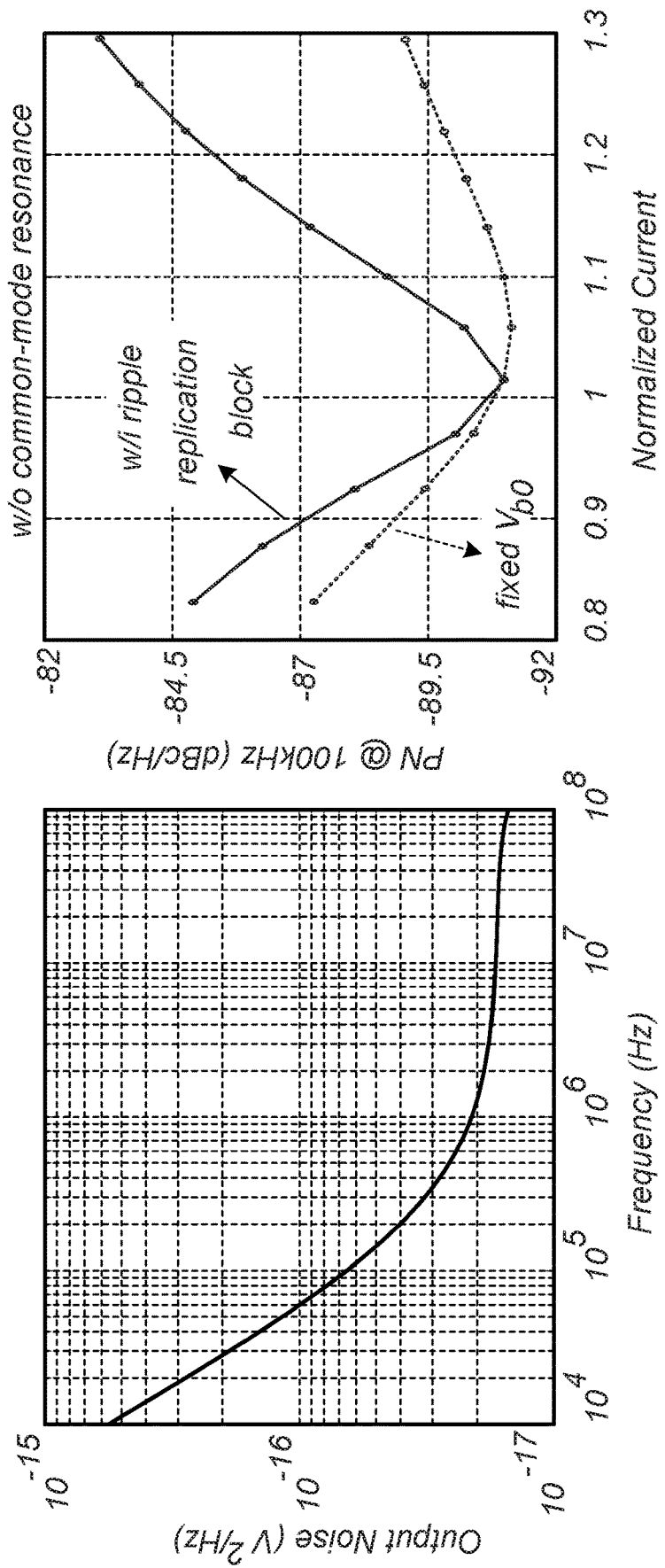
FIG. 8a shows the output noise of the ripple replication block, according to an example embodiment.
Figure 8C:
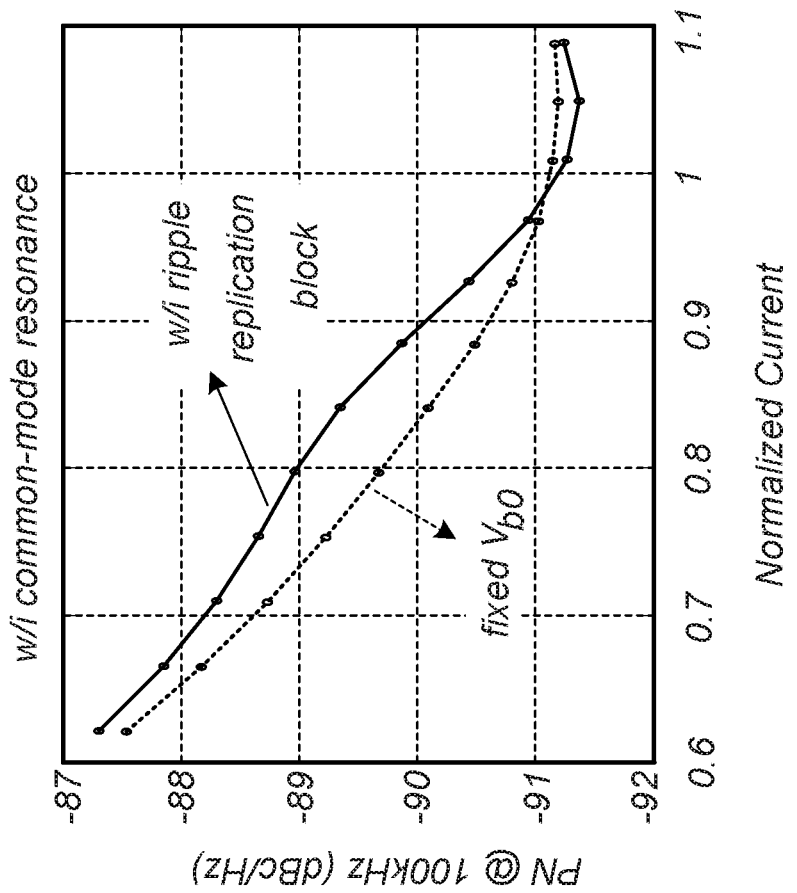
FIG. 8c shows the phase degradation of the LC oscillator with and without the common mode resonance, according to an example embodiment.
Figure 8B:
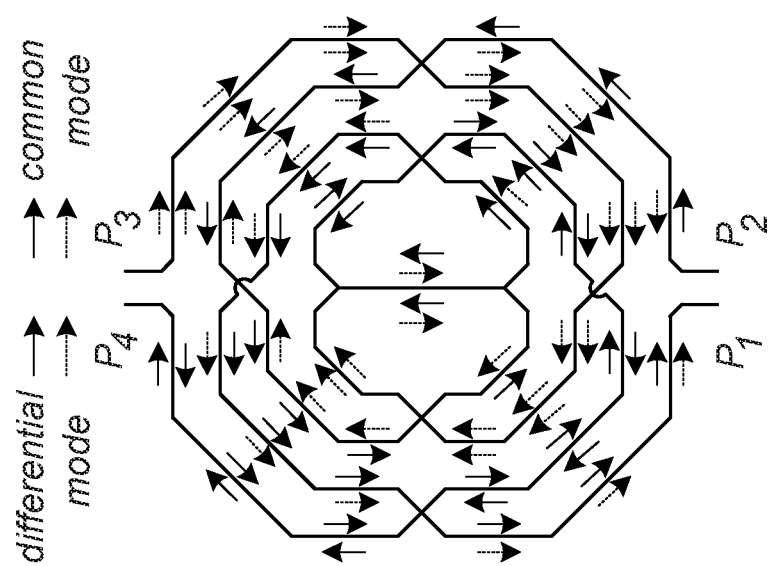
FIG. 8b shows a schematic of a symmetrical transformer of the LC oscillator, according to an example embodiment.

For the LC oscillator 110, as in this example, a complementary cross-coupled oscillator structure may be chosen. This leads to lower power consumption compared to its NMOS- and PMOS-only counterparts at same $V_{DD}$ and equivalent parallel resistance of the tank. The designed oscillator uses a transformer-based resonant tank. Since the ripple replication block is connected to the gate of supply current source $M_0$, the replicator's output noise (see FIG. 8a), especially flicker noise of transistors $M_{b0,2}$, will modulate the oscillator's current, thus up-converting into output phase noise (PN) through a mechanism such as Groszkowski's effect. An implicit common-mode resonance technique is applied, which limits PN degradation. Single-ended capacitor banks are connected to a symmetrical transformer, as shown in FIG. 8b, are used to tune the common-mode resonance frequency to around $2 \times f_{osc}$. Simulation results in FIG. 8c show that the PN degradation can be reduced to <1 dB when the implicit common-mode technique is used. Both the NMOS and PMOS cross-coupled transistors $M_{1-4}$ provide the negative transconductance in the complementary structure. The body terminals of the PMOS cross-coupled pair, $M_{1,2}$, are deliberately connected to their source terminals to avoid the body effect. Otherwise, their threshold voltage, $V_{th}$, would be modulated under supply variations thus varying the oscillation amplitude $V_{osc}$, consequently pushing $f_{osc}$. Simulation results show that the supply pushing due to this body effect could be as high as 9.5 MHz/V Note that the above mentioned NMOS alternative to the supply current transistor $M_0$ would not be effective unless a costly triple-well technology is used.

Figure 9:
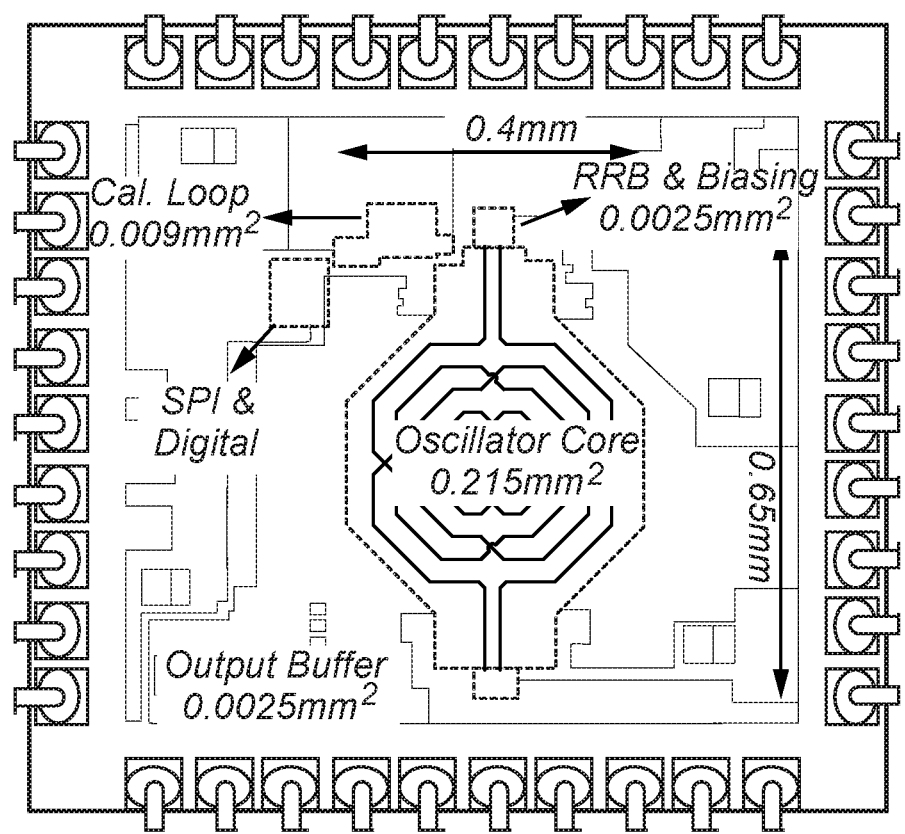
FIG. 9 shows a chip micrograph of the LC oscillator with reduced supply pushing, according to an example embodiment.

The example LC oscillator 110 with the proposed powering arrangement 100 with feed-forward ripple replication and cancellation was implemented in TSMC 40-nm 1P8M CMOS process without ultra-thick metal layers. The proposed calibration loop 140 was also integrated on-die. FIG. 9 shows the chip micrograph. The total active area is 0.23 mm², in which the oscillator core occupies about 0.215 mm². The additional area occupied by the ripple replication block with its biasing circuit and the calibration loop 140 is just 0.012 mm². The symmetrical transformer was designed by stacking the top two metal layers with the aluminum capping layer, which enhances the tank's Q-factor. The spacing between each turn of the transformer was optimized for a magnetic coupling factor of 0.31. The simulated differential inductance of the transformer is 1.7 nH. The Q-factor of the whole tank is estimated to be ~7. The capacitor banks are split into a 5-bit differential bank and a 5-bit common-mode bank to tune the common-mode resonance frequency.

Figure 10A:
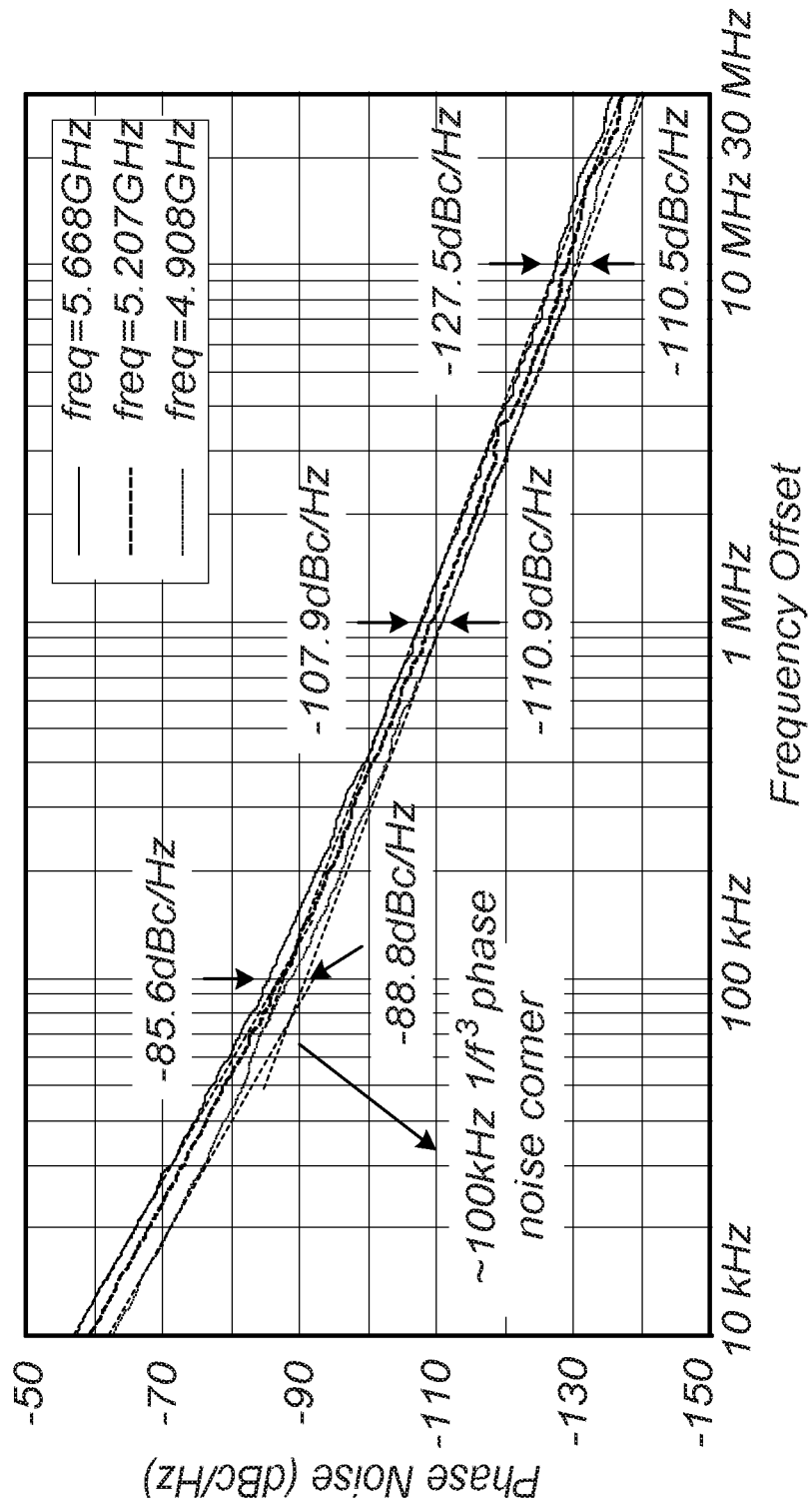
FIG. 10a shows measured phase noise of the oscillator across a gain tuning range of the calibration loop, according to an example embodiment.
Figure 10B:
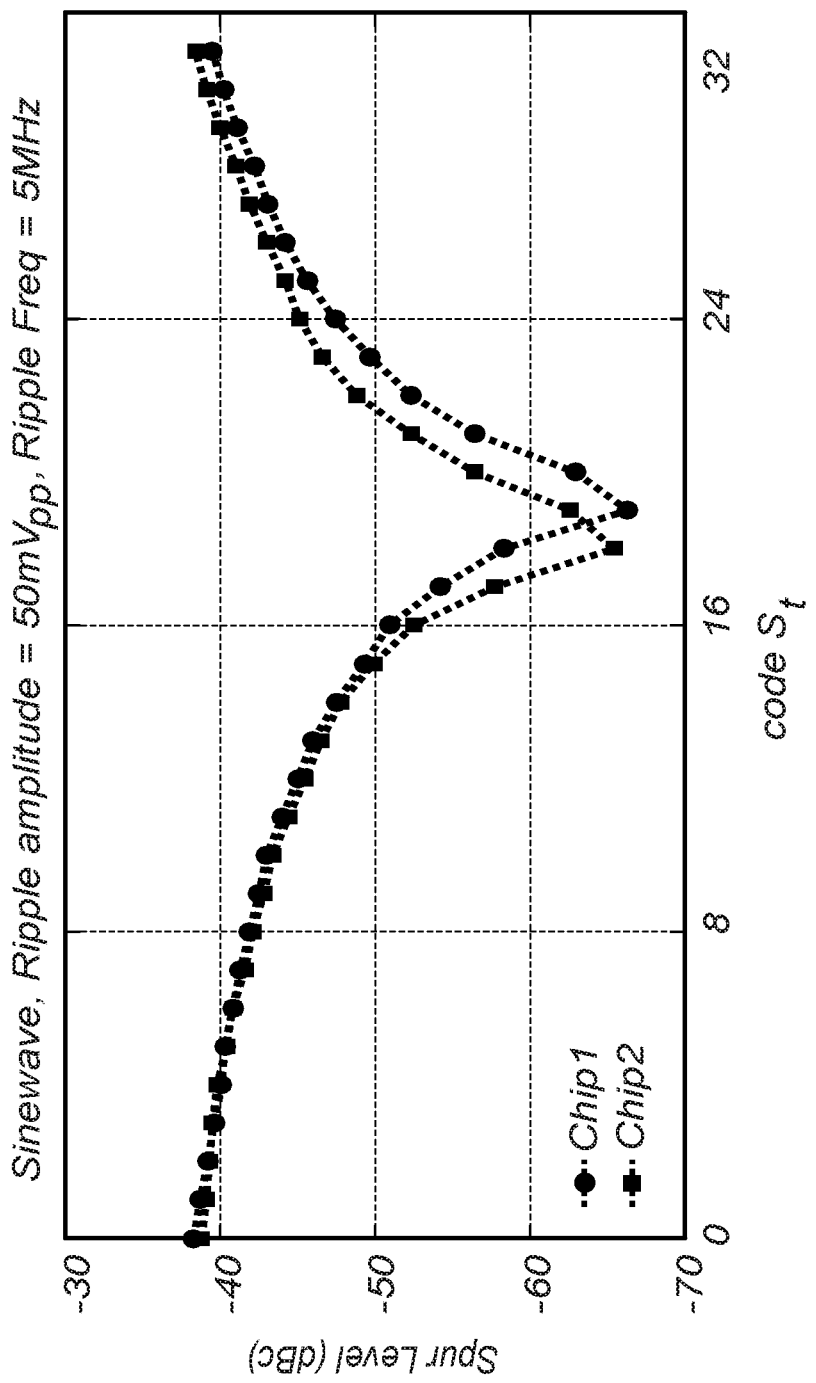
FIG. 10b shows measured spur level over a control code $S_t$ provided by the calibration loop, according to an example embodiment.

The measured tuning range (TR) is 4.9-5.7 GHz (15%). FIG. 10a shows the measured PN performance across the TR. PN varies from −108 to 111 dBc/Hz @1 MHz offset, with a flicker noise corner of around 100 kHz. To verify the concept of the proposed technique, the control code $S_t$ of the ripple replication block is manually swept while a 50 m $V_{pp}$ (peak-to-peak) 5 MHz sinusoidal ripple is applied on the oscillator supply. As shown in FIG. 10b, there exists an optimum code at which the spur level is lower than −60 dBc, corresponding to a >27 dB improvement over the $S_t$=0 case. Note that G≈1 when $S_t$=0, and the oscillator already benefits from the significantly reduced supply pushing.

Figure 11A:
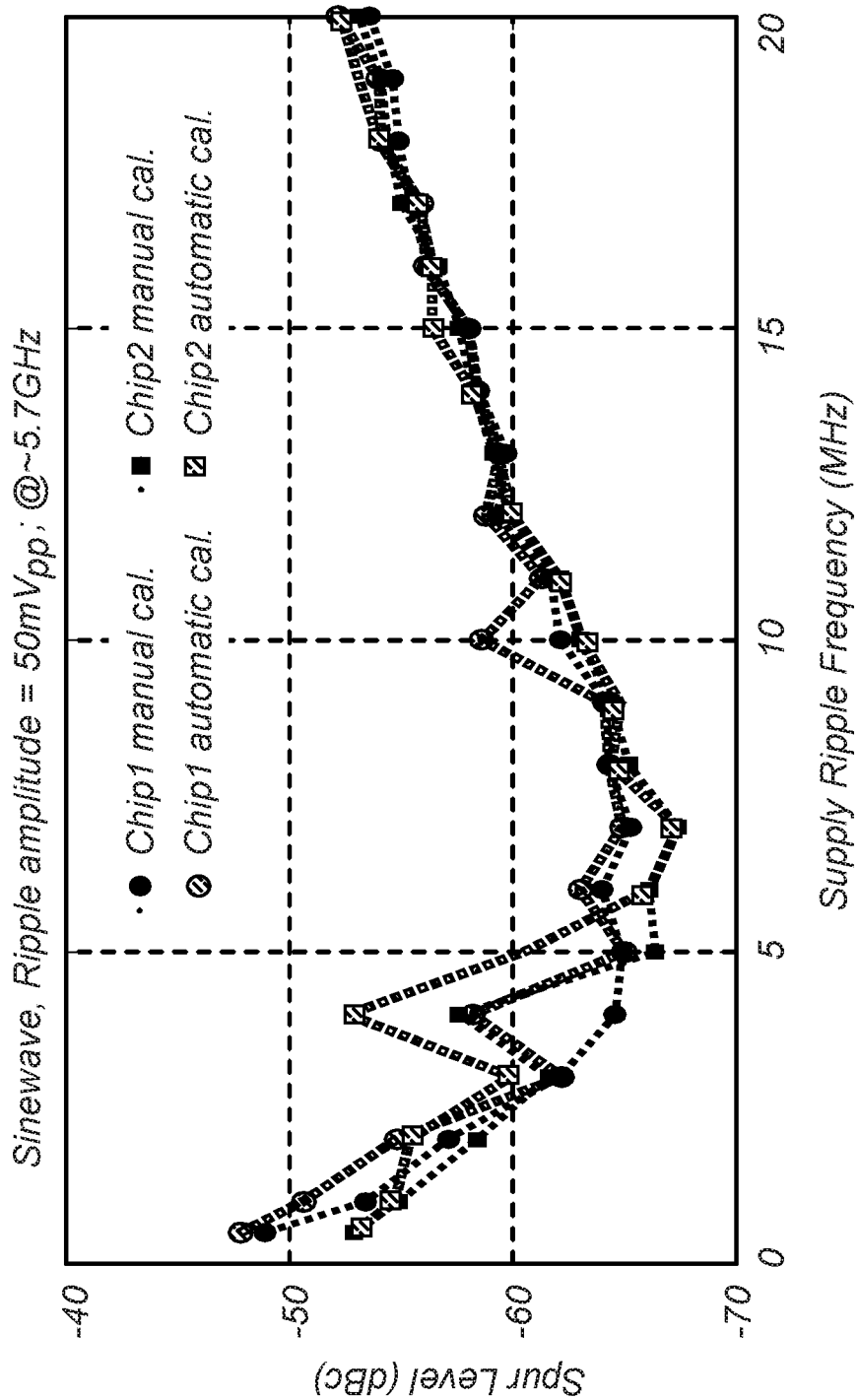
FIG. 11a shows measured spur levels over sinusoidal ripple frequency, according to an example embodiment.
Figure 11B:
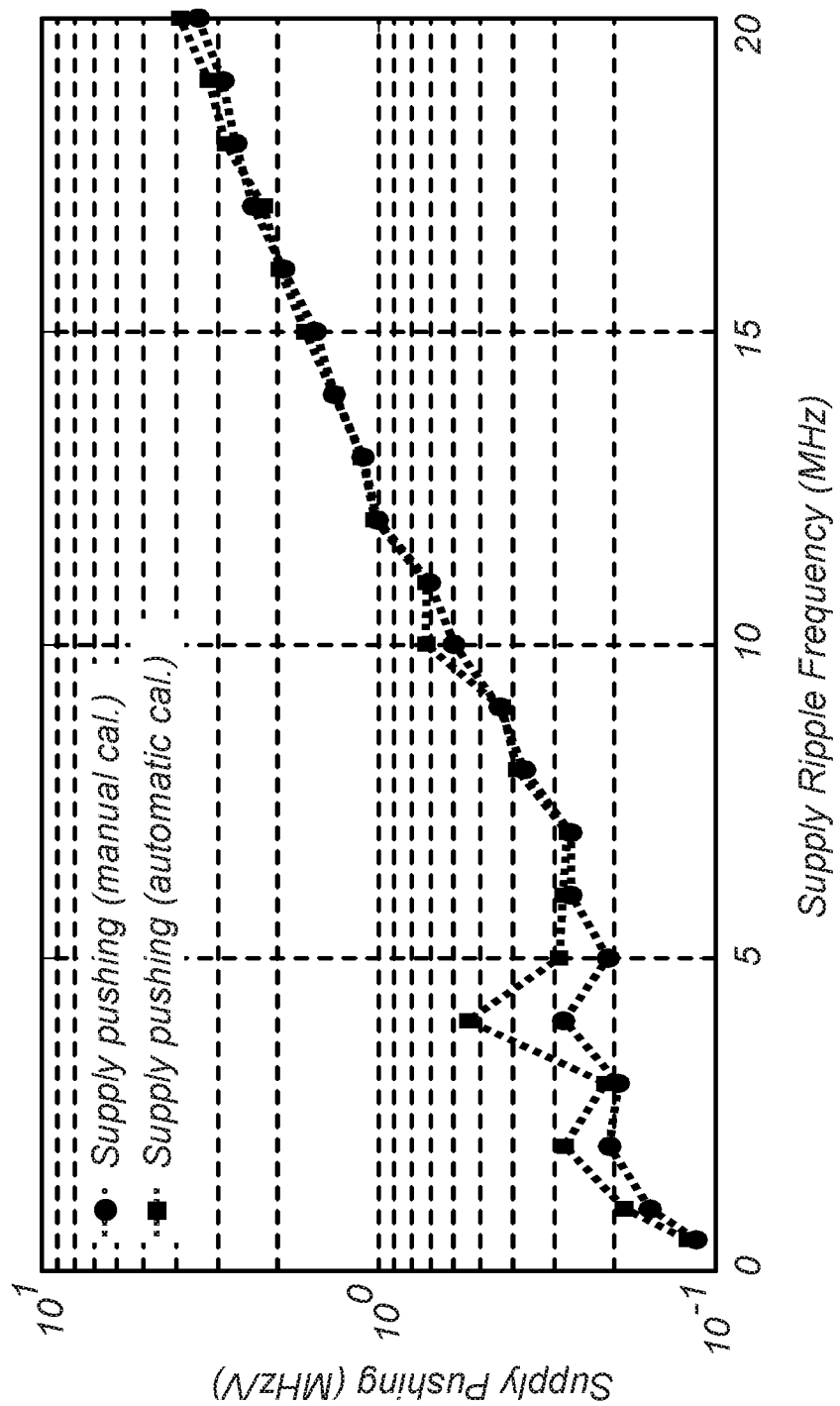
FIG. 11b shows the corresponding supply pushing for both manual and automatic calibrations, according to an example embodiment.
Figure 11C:
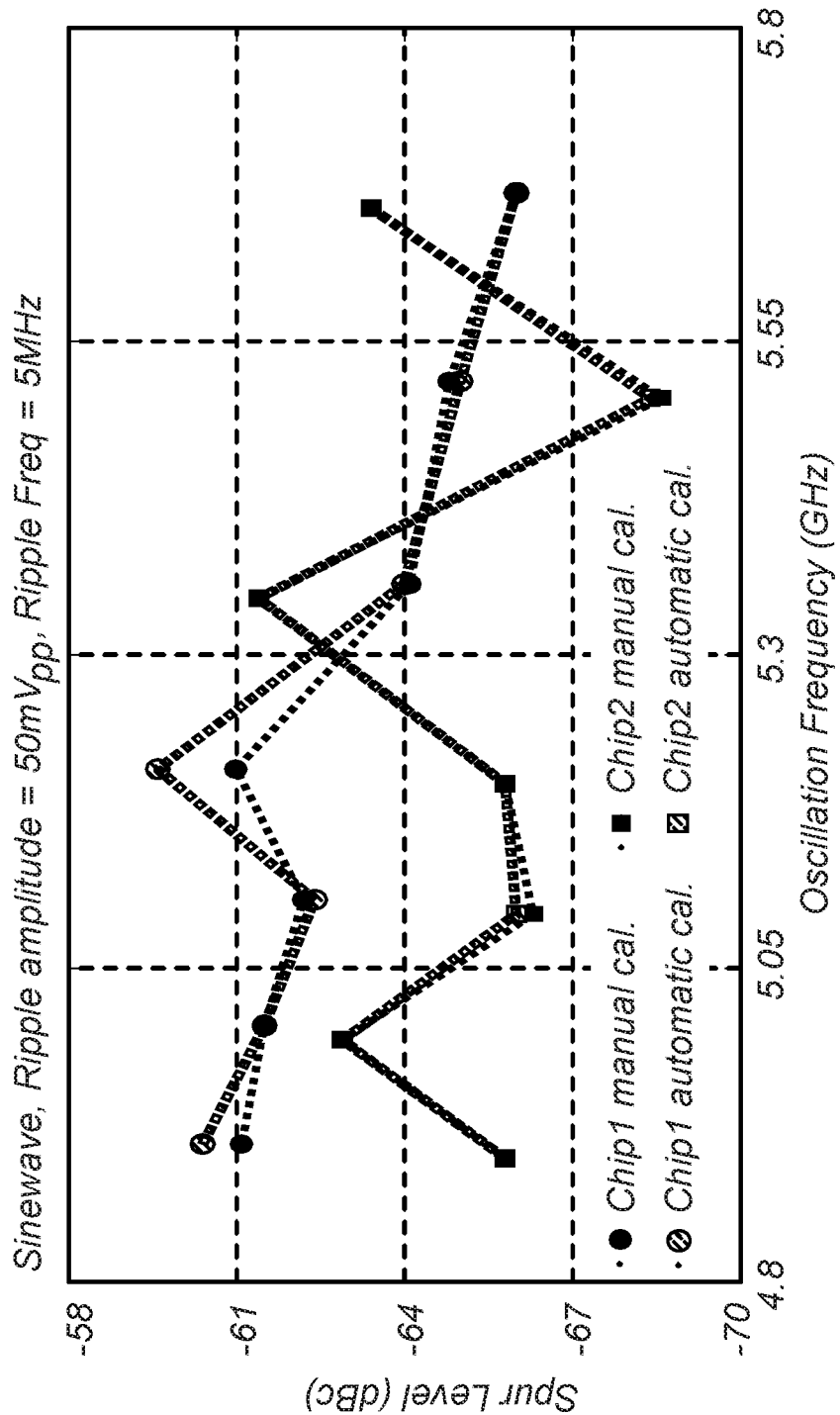
FIG. 11c shows measured spur levels over the oscillation frequency under the sinusoidal ripple, according to an example embodiment.
Figure 11D:
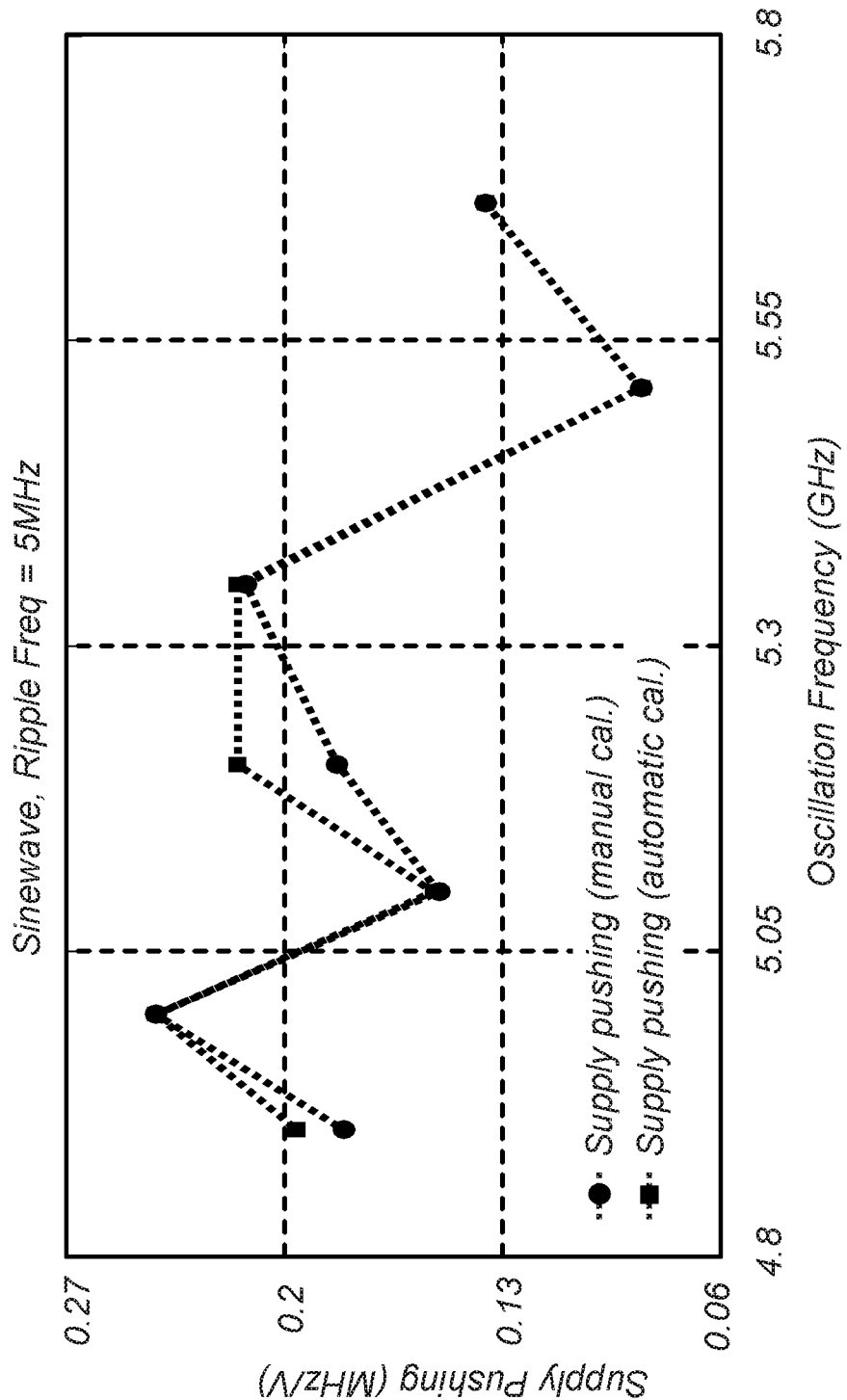
FIG. 11d shows the corresponding supply pushing for both manual and automatic calibrations, according to an example embodiment.
Figure 12A:
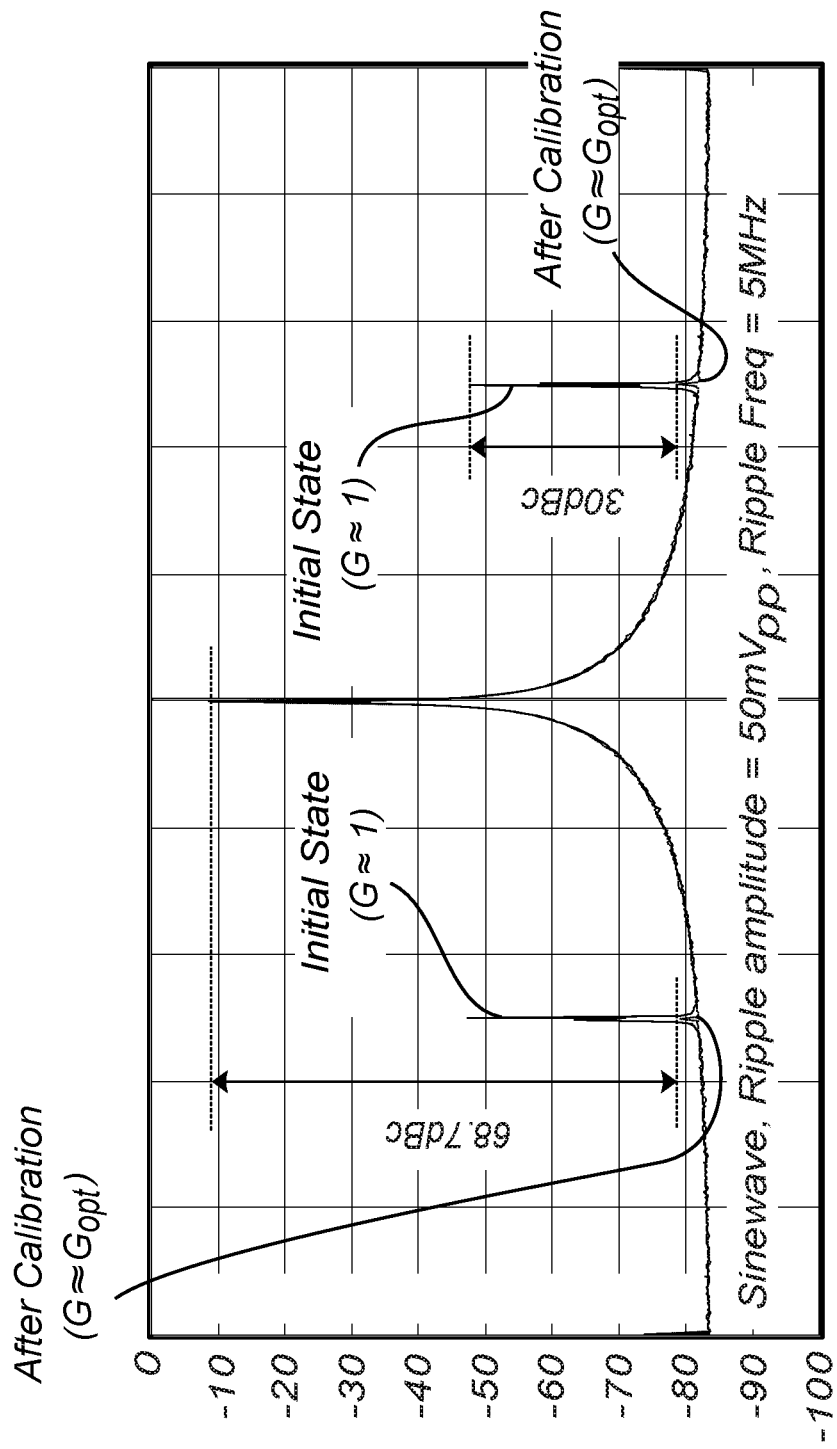
FIG. 12a shows measured oscillator spectra before and after calibration under 50 mV peak-to-peak 5 MHz sinusoidal ripple, according to an example embodiment.

The effectiveness of the automatic calibration loop 140 is verified in FIG. 12a, which compares the spectra before and after the calibration. With the supply contamination by a 50 m $V_{pp}$ 5 MHz sinusoidal ripple, the spur level is reduced by 30 dBc and reaches −68.7 dBc after the calibration. FIG. 11a shows the measured spur level over the frequency of the supply ripple. The proposed technique achieves ≤−49 dBc optimum spur levels under ≤50 m $V_{pp}$, 0.5-20 MHz sinusoidal ripples, while the calibrated spur levels closely follow the optimum ones in most cases. The increase of the spur level at high ripple frequencies is due to the bandwidth limitation of the ripple replication block, and could be extended by expending more power. In FIG. 11c, the spur level is measured across the tuning range of the oscillator. The worst-case spur under a 50 m $V_{pp}$ 5 MHz sinusoidal ripple is ≤59 dBc. FIG. 11b and FIG. 11d show the oscillator's supply pushing based on the measured spur levels. When the ripple frequency is lower than 12 MHz, the calculated supply pushing is lower than 1 MHz/V for both the optimum and calibrated cases.

Figure 11E:
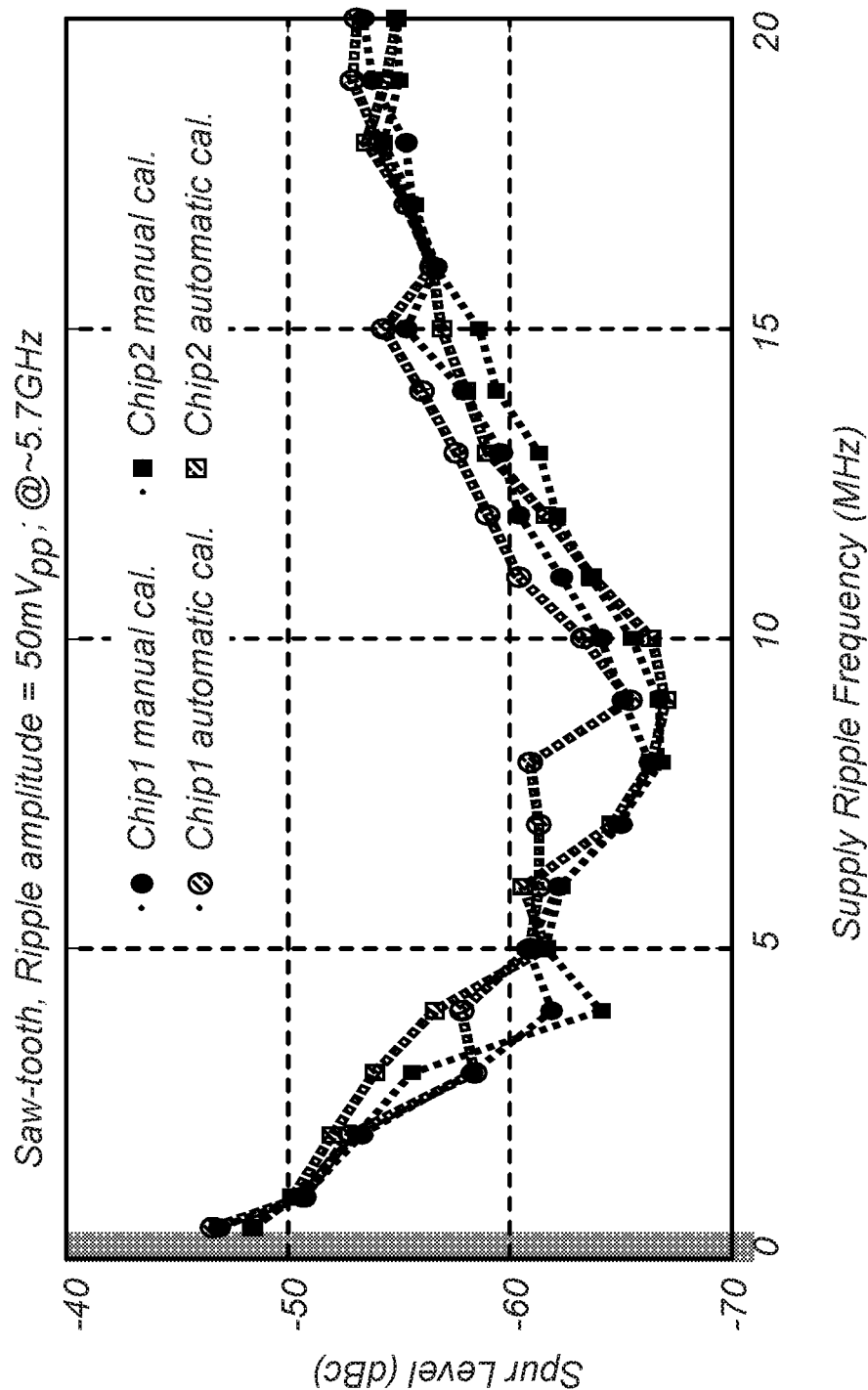
FIG. 11e shows measured spur levels over the frequency of sawtooth ripple, according to an example embodiment.
Figure 11F:
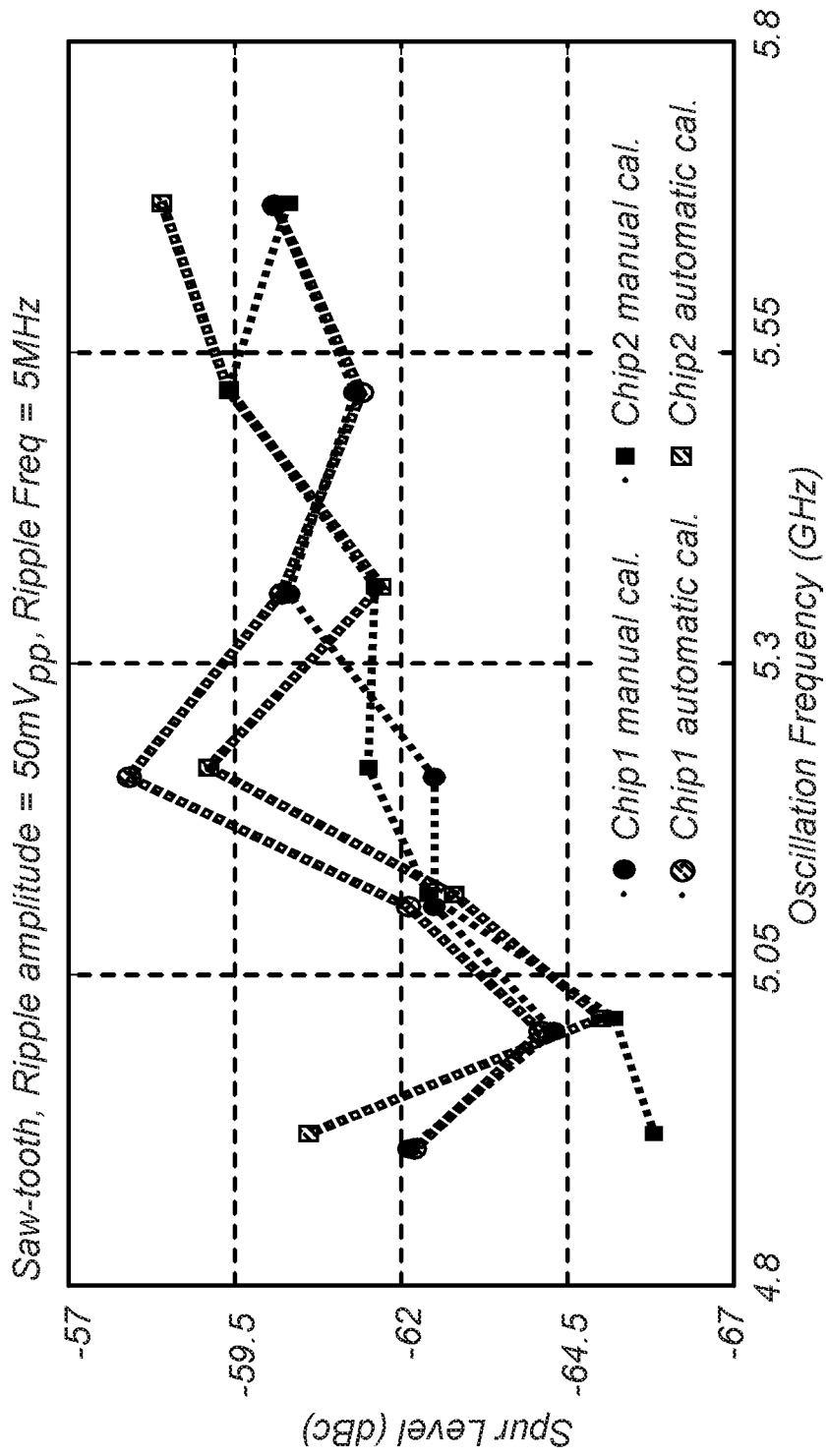
FIG. 11f shows measured spur levels over the oscillation frequency under the sawtooth ripple, according to an example embodiment.
Figure 12B:
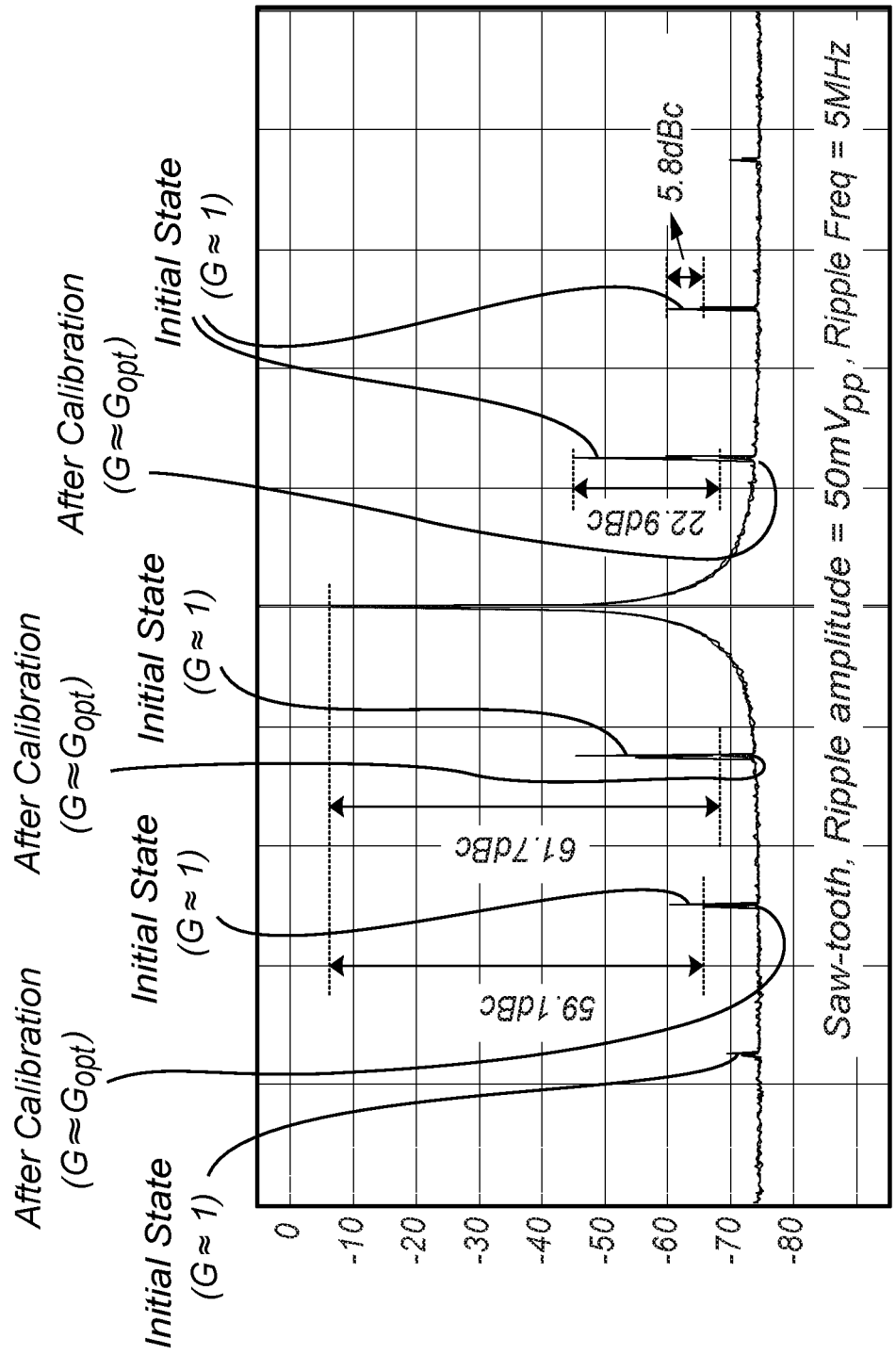
FIG. 12b shows measured oscillator spectra before and after calibration under 50 mV peak-to-peak 5 MHz sawtooth ripple, according to an example embodiment.

Similar measurements were also performed for saw-tooth ripples. FIG. 12b compares the spectra before and after the calibration. Under a 50 m $V_{pp}$ 5 MHz saw-tooth ripple, the spur at the fundamental offset is reduced by 22.9 dB and reaches −61.7 dBc after the calibration. For spurs at higher harmonics, the suppression is also observed, but with lower magnitudes (5.8 dBc suppression for the second harmonic reaching −59.1 dBc after the calibration). FIG. 11e shows the spur levels over the ripple frequency. The worst-case spur of −47 dBc is found under ≤50 m $V_{pp}$, 0.5-20 MHz saw-tooth ripples, while the calibration results follow the optima. In FIG. 11f, the spurs are lower than −58 dBc within the entire tuning range under a 50 m $V_{pp}$ 5 MHz saw-tooth ripple.

Figure 12C:
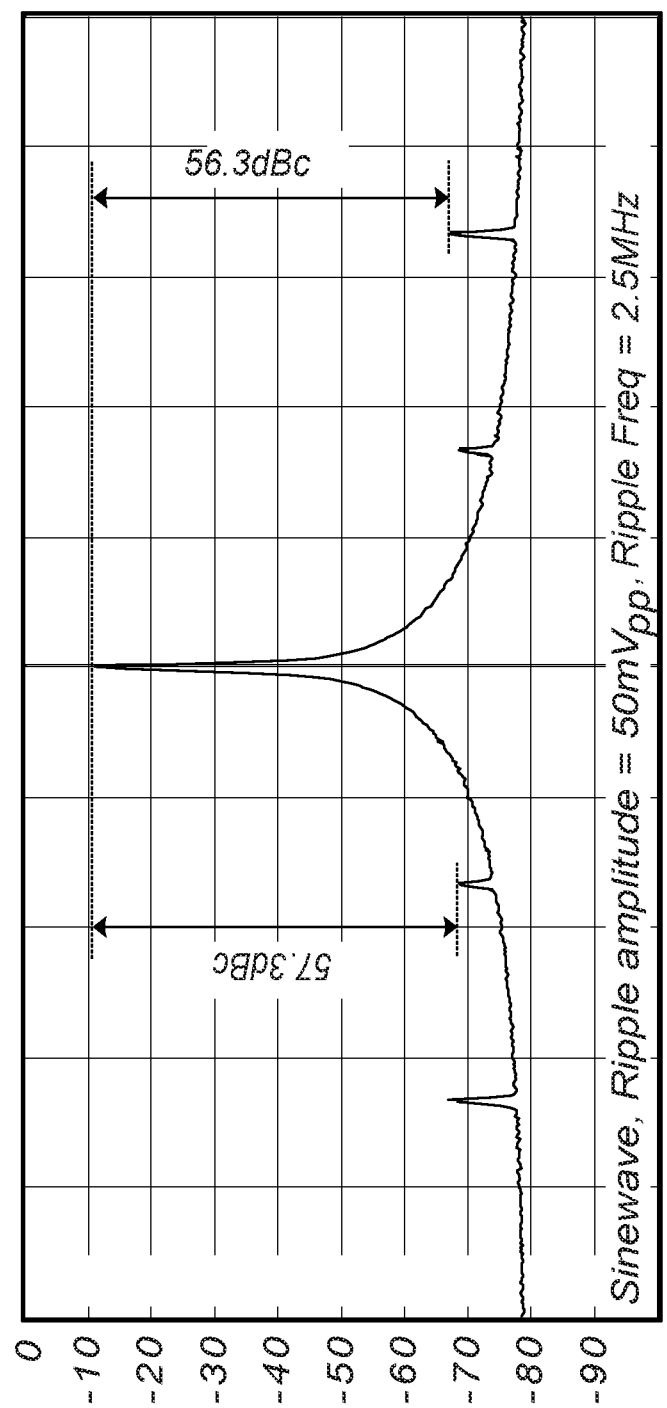
FIG. 12c shows measured oscillator spectra under 50 mV peak-to-peak 2.5 MHz sinusoidal ripple, according to an example embodiment.
Figure 12D:
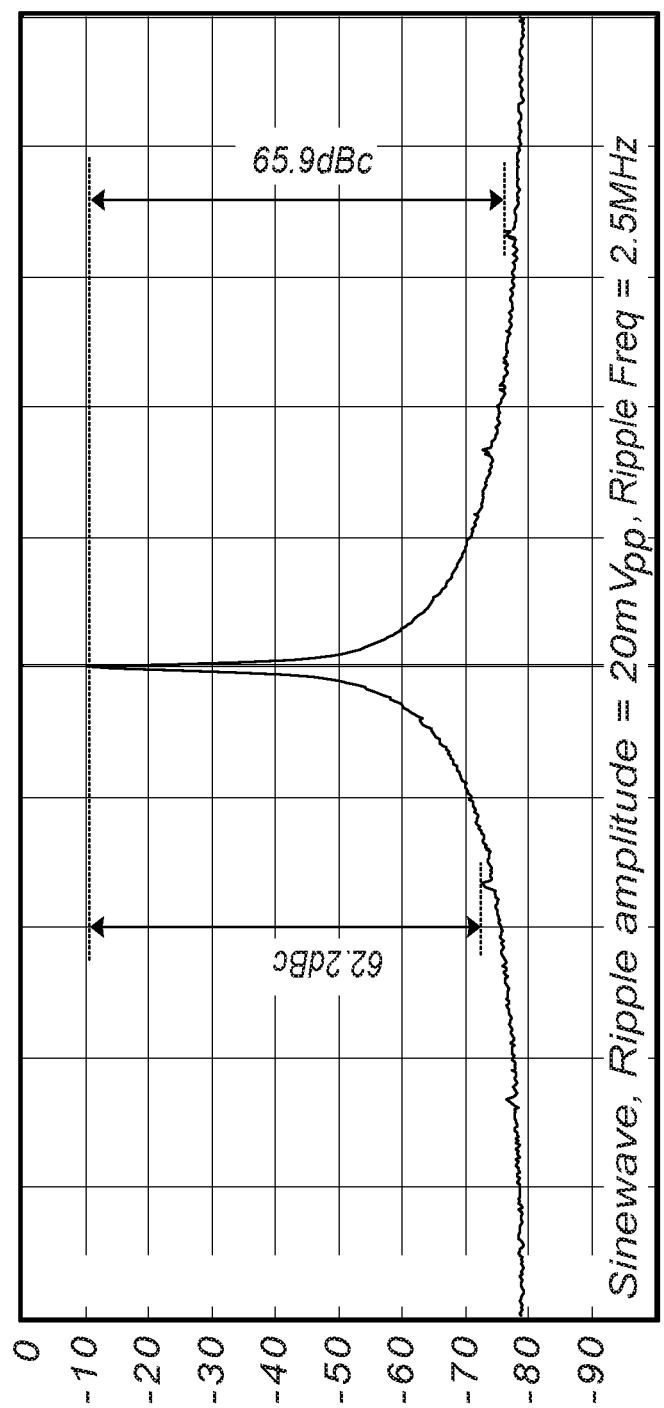
FIG. 12d shows measured oscillator spectra under 20 mV peak-to-peak 2.5 MHz sinusoidal ripple, according to an example embodiment.

FIG. 12c shows the measured oscillator spectrum under a 50 m $V_{pp}$ 2.5 MHz supply ripple. A spur can also be observed at an offset frequency of 5 MHz (i.e. 2×2.5 MHz). This second ripple harmonic spur mainly comes from the nonlinearity of the fractional part of the ripple replication block. To achieve fine tuning resolution, the transistors in this part are biased with small overdrive voltage, resulting in $V_{IP2} \approx 140$ mV and $g_m/I_{ds} \approx 19$. To improve the performance at the second ripple these transistors can be re-sized and biased with a different linearity and smaller $g_m/I_{ds}$. The resulting increase in current consumption would be quite small (i.e. ~12 µA) since the current consumed by the fractional part is much smaller than that consumed by the integer part. Also, the spur at the second ripple harmonic reduces faster with the ripple amplitude. As shown in FIG. 12c, the measured spur level at the second harmonic is reduced to −65.9 dBc under a 20 m $V_{pp}$ ripple, which should bear little practical consequences.

Figure 13:
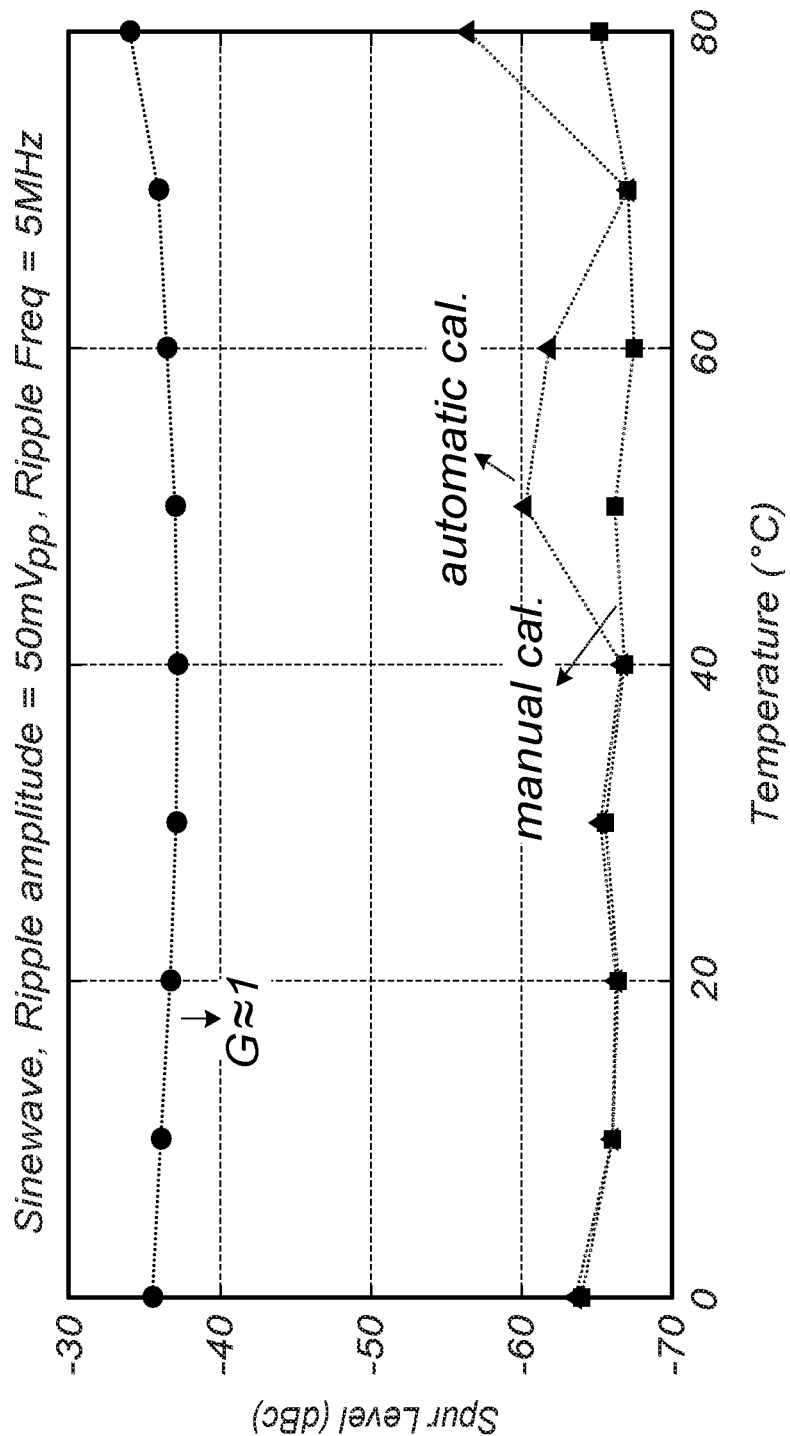
FIG. 13 shows measured spur levels over 0-80° C., according to an example embodiment.

The IC chip was also measured over the temperature range of 0-80 C, and the results are shown in FIG. 13. The spur levels are lower than −60 dBc, except for the calibrated one at 80 C.

Table I summarizes the features and performance of the proposed technique.

TABLE 1

| Description | | | Feed-forward compensation |
|---|---|---|---|
| Osc. Type | | | LC |
| Tech. (nm) | | | 40 (w/o UTM) |
| $V_{pp}$ (V) | | | 1.0 |
| Frequency Range (GHz) | | | 4.9-5.7 (15%) |
| PN (dBc/Hz) @1 MHz | | | −107.9 to −110.9 |
| Ripple amplitude | | | 50 m$V_{pp}$ |
| Sinewave | Spur (dBc) | @1 MHz | <−54 |
| | | @5 MHz | <−58 |
| | $K_{sup}$ (MHz/V) | @1 MHz | <0.16* |
| | | @5 MHz | <0.5* |
| | Improv. (dBc) | @1 MHz | 18-24** |
| | | @5 MHz | 24-30** |
| Saw-tooth | Spur (dBc) | @1 MHz | <−50 |
| | | @5 MHz | <−58 |
| | Improv. (dBc) | @1 MHz | 11.3** |
| | | @5 MHz | 22-27** |

TABLE 1-continued

| Description | Feed-forward compensation |
|---|---|
| Osc. Power Cons. (mW) | 0.8-1.3 |
| Power Cons. $K_{sup}$ Reduction Tech. (mW) | 0.2 |
| Area of $K_{sup}$ Reduction Tech (mm$^2$) | 0.012 |
| Total area (mm$^2$) | 0.23 |

*Calculated value from the spur level.
**Compared with the case $S_t = 0$ (G = 1) where the supply pushing of the oscillator is already suppressed.

With the present disclosure, it is possible to significantly reduce supply pushing in current-mode LC oscillators while consuming no extra voltage headroom. The proposed ripple replication block 130 generates an amplified supply ripple replica $GA_{ripple}$ at the gate terminal of the oscillator's 110 supply current source, in order to stabilize the supply current and oscillation amplitude under supply variations. The oscillation frequency is stabilized in turn, leading to <1 MHz/V supply pushing for supply ripples up to 12 MHz. To suppress the phase noise degradation due to the extra circuitry, implicit common mode resonance is used in the resonant tank. A calibration loop 140 with an algorithm is also integrated on-chip, which finds the optimum gain G for the ripple replication block 130.

The above disclosure has mainly been described with reference to a limited number of examples. However, other examples than the ones disclosed above are equally possible within the scope of the disclosure, as defined by the appended claims.

What is claimed is:

1. An LC oscillator powering arrangement, comprising:
an LC oscillator comprising a resonant tank, wherein the LC oscillator is configured to provide an oscillating signal output;
a current source configured to supply the LC oscillator with a supply current that flows entirely into the resonant tank, wherein, the current source is controllable via a control voltage and supplied with a supply voltage subject to a supply voltage ripple; and
a replication block configured to generate a replica of the supply voltage ripple directly from the supply voltage and to overlay the replica on the control voltage.

2. The arrangement of claim 1, wherein the current source is a MOS transistor.

3. The arrangement of claim 2, wherein the current source is a PMOS transistor, wherein the supply voltage is applied at a source terminal of the PMOS transistor, wherein the control voltage is applied at a gate terminal of the PMOS transistor, and wherein the supply current is drawn from a drain terminal of the PMOS transistor.

4. The arrangement of claim 1, provided on a single chip.

5. An LC oscillator powering arrangement, comprising:
an LC oscillator configured to provide an oscillating signal output;
a current source configured to supply the LC oscillator with a supply current, wherein the current source is controllable via a control voltage and supplied with a supply voltage subject to a supply voltage ripple;
a replication block configured to generate a replica of the supply voltage ripple directly from the supply voltage and to overlay the replica on the control voltage; and
a calibration block, wherein the replication block is configured to amplify the replica with a tunable fractional gain settable by the calibration block, and wherein the calibration block is connected to the oscillating signal output of the LC oscillator and is configured to minimize an amplitude variation of the oscillating signal output of the LC oscillator by determining an optimum value of the tunable fractional gain of the replication block.

6. The arrangement of claim 5, wherein the calibration block comprises:
a detector configured to detect the amplitude variation;
a comparator configured to compare the amplitude variation with a reference voltage; and
a controller connected to the comparator and configured to set the tunable fractional gain of the replication block during calibration.

7. The arrangement of claim 6, wherein the detector comprises a peak detector, an amplifier, and a low-pass filter.

8. The arrangement of claim 6, wherein during the minimizing of the amplitude variation, the reference voltage is set to a value larger than a minimum of the amplitude variation, and wherein the controller is configured to determine the optimum value of the tunable fractional gain as an average of a lower gain corresponding to a first output transition of the comparator and a higher gain corresponding to a second output transition of the comparator.

9. The arrangement of claim 5, wherein the tunable fractional gain is settable by a n-bit digital code, wherein n is a predetermined integer.

10. The arrangement of claim 9, wherein the replication block comprises a replicating part that provides unitary gain and a fractional part that provides the tunable fractional gain, wherein the fractional part comprises n injection blocks each individually switchable by an individual bit in the n-bit digital code.

11. The arrangement of claim 10, wherein the replicating part comprises a diode-connected PMOS transistor in series with two NMOS transistors forming a cascode, wherein each of the injection blocks comprises a current-source PMOS transistor in series with a switching PMOS transistor, a gate terminal of the switching PMOS transistor being connected to a corresponding the individual bit of the digital code, and a drain terminal of the switching PMOS transistor being connected to a node of the cascode.

12. A method of powering an LC oscillator, the method comprising:
applying a supply voltage to drive a current source, the supply voltage being subject to a supply voltage ripple;
generating, by way of a replication block, a replica of the supply voltage ripple directly from the supply voltage;
applying a control voltage at the current source, the control voltage being overlaid with the replica; and
supplying the LC oscillator with a supply current from the current source such that the supply current flows entirely into a resonant tank of the LC oscillator.

13. The method of claim 12, wherein the current source is a MOS transistor.

14. The method of claim 13, wherein the current source is a PMOS transistor, wherein the supply voltage is applied at a source terminal of the PMOS transistor, wherein the control voltage is applied at a gate terminal of the PMOS transistor, and wherein the supply current is drawn from a drain terminal of the PMOS transistor.

15. A method of powering an LC oscillator, the method comprising:
applying a supply voltage to drive a current source, the supply voltage being subject to a supply voltage ripple;
generating, by way of a replication block, a replica of the supply voltage ripple directly from the supply voltage;
applying a control voltage at the current source, the control voltage being overlaid with the replica;

supplying the LC oscillator with a supply current from the current source;

amplifying the replica by way of the replication block with a tunable fractional gain settable by a calibration block that is connected to an oscillating signal output of the LC oscillator; and minimizing, via the calibration block, an amplitude variation of the oscillating signal output of the LC oscillator by determining an optimum value of the tunable fractional gain of the replication block.

16. The method of claim 15, wherein the calibration block comprises:

a detector configured to detect the amplitude variation;

a comparator configured to compare the amplitude variation with a reference voltage; and a controller connected to the comparator and configured to set said tunable fractional gain of the replication block during calibration.

17. The method of claim 16, wherein during the minimizing of the amplitude variation, the reference voltage is set to a value larger than a minimum of the amplitude variation, and wherein the controller is configured to determine the optimum value of the tunable fractional gain as an average of a lower gain corresponding to a first output transition of the comparator and a higher gain corresponding to a second output transition of the comparator.

18. The method of claim 15, wherein the tunable fractional gain is settable by a n-bit digital code, wherein n is a predetermined integer.

19. The method of claim 18, wherein the replication block comprises a replicating part that provides unitary gain and a fractional part that provides the tunable fractional gain, wherein the fractional part comprises n injection blocks each individually switchable by an individual bit in the n-bit digital code.

20. The method of claim 19, wherein the replicating part comprises a diode-connected PMOS transistor in series with two NMOS transistors forming a cascode, wherein each of the injection blocks comprises a current-source PMOS transistor in series with a switching PMOS transistor, a gate terminal of the switching PMOS transistor being connected to a corresponding the individual bit of the digital code and a drain terminal of the switching PMOS transistor being connected to a node of the cascode.

* * * * *